United States Patent [19]
Glezer et al.

[11] Patent Number: 5,957,413
[45] Date of Patent: Sep. 28, 1999

[54] MODIFICATIONS OF FLUID FLOW ABOUT BODIES AND SURFACES WITH SYNTHETIC JET ACTUATORS

[75] Inventors: Ari Glezer, Atlanta; Barton L. Smith; Mark A. Trautman, both of Decatur, all of Ga.

[73] Assignee: Georgia Tech Research Corporation, Atlanta, Ga.

[21] Appl. No.: 08/869,374

[22] Filed: Jun. 5, 1997

Related U.S. Application Data

[63] Continuation of application No. 08/489,490, Jun. 12, 1995, Pat. No. 5,758,823.
[51] Int. Cl.$^6$ .................................................. B64C 21/06
[52] U.S. Cl. ........................................................ 244/208
[58] Field of Search .................................... 244/207, 208; 417/413.2, 560, 479, 480; 239/4, 102.2

[56] References Cited

U.S. PATENT DOCUMENTS

| | | | |
|---|---|---|---|
| 1,485,715 | 3/1924 | Robinson | 239/423 |
| 1,878,088 | 9/1932 | Zwikker . | |
| 2,498,990 | 2/1950 | Fryklung | 259/72 |
| 2,591,083 | 4/1952 | Maier | 51/2 |
| 2,761,833 | 9/1956 | Ward | 222/212 |
| 2,812,636 | 11/1957 | Kadosch | 239/265.23 X |
| 3,058,014 | 10/1962 | Camp | 310/8.7 |
| 3,262,658 | 7/1966 | Reilly | 244/207 |
| 3,361,067 | 1/1968 | Webb | 103/1 |
| 3,425,058 | 1/1969 | Babington | 239/434 X |
| 3,985,344 | 10/1976 | McCord | 259/1 |
| 4,131,505 | 12/1978 | Davis, Jr. | 156/580.1 |
| 4,171,852 | 10/1979 | Haentjens | 406/85 |
| 4,206,831 | 6/1980 | Welch et al. | 181/159 |
| 4,363,991 | 12/1982 | Edelman | 310/316 |
| 4,369,857 | 1/1983 | Frazzer et al. | 181/159 |
| 4,473,185 | 9/1984 | Peterson et al. | 239/8 |
| 4,516,747 | 5/1985 | Lurz | 244/204 |
| 4,533,082 | 8/1985 | Maehara et al. | 239/4 |
| 4,533,255 | 8/1985 | Gronholz et al. | 366/108 |
| 4,548,240 | 10/1985 | Graham | 138/30 |
| 4,611,553 | 9/1986 | Iwata et al. | 118/50 |

(List continued on next page.)

FOREIGN PATENT DOCUMENTS

| 3320481 | 12/1984 | Germany . |
|---|---|---|
| 4-103494 | 11/1967 | Japan . |
| 590503 | 11/1974 | U.S.S.R. . |

OTHER PUBLICATIONS

AIAA–97–2326; Effects of Zero–Mass "Synthetic" Jets On The Aerodynamics Of The NACA–0012 Airfoil; Ahmed A. Hassan and Ram D. JanakiRam; 1997.

Ingard, et al., "Acoustic Nonlinearity of an Oriface," The Journal of the Acoustical Society of America, vol. 42, No. 1, 1967, pp. 6–17.

Mednikov, et al., "Experimental study of intense acoustic streaming," Sov. Phys. Acoust., vol. 21, No. 2, Mar.–Apr. 1975, pp. 152–154.

Williams, et al., "The Mechanism of Flow Control on A Cylinder with the Unsteady Bleed Technique," AIAA 91–0039, Jan. 7–10, 1991.

Coe, et al., "Micromachined Jets for Manipulation of Macro Flows," 1994 Solid–State Sensor and Actuator Workshop, Hilton Head, SC.

*Primary Examiner*—Kevin Weldon
*Attorney, Agent, or Firm*—Thomas, Kayden, Horstemeyer & Risley

[57] ABSTRACT

The present invention involves a system for altering the aerodynamic shape and/or fluid flow field about a solid body. The preferred embodiment comprises a synthetic jet actuator embedded in a solid body, with the jet orifice built into the body surface. The synthetic jet actuator generates a series of fluid vortices emanating from the orifice so as to entrain fluid external to the actuator chamber and form a synthetic jet stream. A recirculating flow region is formed along the solid body surface about the synthetic jet orifice. As a result the apparent aerodynamic shape of the body is altered. Consequently, if the solid body is placed in a fluid flow field, the entire fluid flow field is altered by the operation of the synthetic jet actuator.

16 Claims, 12 Drawing Sheets

U.S. PATENT DOCUMENTS

| | | | |
|---|---|---|---|
| 4,635,749 | 1/1987 | Tattersall | 181/152 |
| 4,646,945 | 3/1987 | Steiner et al. | 222/213 X |
| 4,697,769 | 10/1987 | Blackwelder et al. | 244/199 |
| 4,702,418 | 10/1987 | Carter et al. | 239/4 X |
| 4,747,523 | 5/1988 | Dobbs et al. | 222/383 |
| 4,802,642 | 2/1989 | Mangiarotty | 244/200 |
| 5,040,560 | 8/1991 | Glezer et al. | 137/13 |
| 5,119,840 | 6/1992 | Shibata | 134/184 |
| 5,199,856 | 4/1993 | Epstein et al. | 417/312 |
| 5,203,362 | 4/1993 | Shibata | 134/194 |
| 5,238,153 | 8/1993 | Castillo et al. | 222/189 |
| 5,346,745 | 9/1994 | Bandyopadhyay | 428/156 |
| 5,365,490 | 11/1994 | Katz | 367/1 |
| 5,395,592 | 3/1995 | Bolleman et al. | 422/128 |
| 5,403,617 | 4/1995 | Haaland | 239/101 X |
| 5,411,208 | 5/1995 | Burgener | 239/8 |
| 5,582,348 | 12/1996 | Erickson | 239/8 X |
| 5,758,823 | 6/1998 | Glezer et al. | 239/4 |
| 5,791,601 | 8/1998 | Dancila et al. | 244/207 |

MODIFICATIONS OF FLUID FLOW ABOUT BODIES AND SURFACES WITH SYNTHETIC JET ACTUATORS

RELATED APPLICATIONS

This application is a continuation, and claims priority to application Ser. No. 08/489,490, filed on Jun. 12, 1995 now U.S. Pat. No. 5,758,823.

FIELD OF THE INVENTION

The present invention generally relates to the control of fluid flow about solid surfaces and, more particularly, to a synthetic fluid actuator embedded in a solid surface such as to emit a synthetic jet stream out of the surface and modify the characteristics of fluid flowing over and about the surface.

BACKGROUND OF THE INVENTION

The ability to manipulate and control the evolution of shear flows has tremendous potential for influencing system performance in diverse technological applications, including: mixing and combustion processes, lift and drag of aerodynamic surfaces, and thrust management. That these flows are dominated by the dynamics of a hierarchy of vortical structures, evolving as a result of inherent hydrodynamic instabilities (e.g., Ho & Huerre, 1984), suggests control strategies based on manipulation of these instabilities by the introduction of small disturbances at the flow boundary. A given shear flow is typically extremely receptive to disturbances within a limited frequency band and, as a result, these disturbances are rapidly amplified and can lead to substantial modification of the base flow and the performance of the system in which it is employed.

There is no question, that suitable actuators having fast dynamic response and relatively low power consumption are the foundation of any scheme for the manipulation and control of shear flows. Most frequently, actuators have had mechanically moving parts which come in direct contact with the flow [e.g., vibrating ribbons (Schubauer & Skramstad *J. Aero Sci.* 14 1947), movable flaps (Oster & Wygnanski, 1982), or electromagnetic elements (Betzig AIAA, 1981)]. This class of direct-contact actuators also includes piezoelectric actuators, the effectiveness of which has been demonstrated in flat plate boundary layers (Wehrmann 1967, and Jacobson & Reynolds Stan. U. TF-64 1995), wakes (Wehrmann *Phys. Fl.* 8 1965, 1967, and Berger *Phys. Fl.* S191 1967), and jets (Wiltse & Glezer 1993). Actuation can also be effected indirectly (and, in principle, remotely) either through pressure fluctuations [e.g., acoustic excitation (Crow & Champagne *JFM* 48 1971)] or body forces [e.g., heating (Liepmann et al. 1982, Corke & Mangano *JFM* 209 1989, Nygaard and Glezer 1991), or electromagnetically (Brown and Nosenchuck, *AIAA* 1995)].

Flow control strategies that are accomplished without direct contact between the actuator and the embedding flow are extremely attractive because the actuators can be conformally and nonintrusively mounted on or below the flow boundary (and thus can be better protected than conventional mechanical actuators). However, unless these actuators can be placed near points of receptivity within the flow, their effectiveness degrades substantially with decreasing power input. This shortcoming can be overcome by using fluidic actuators where control is effected intrusively using flow injection (jets) or suction at the boundary. Although these actuators are inherently intrusive, they share most of the attributes of indirect actuators in that they can be placed within the flow boundary and require only an orifice to communicate with the external flow. Fluidic actuators that perform a variety of "analog" (e.g., proportional fluidic amplifier) and "digital" (e.g., flip-flop) throttling and control functions without moving mechanical parts by using control jets to affect a primary jet within an enclosed cavity have been studied since the late 1950's (Joyce, HDL-SR 1983). Some of these concepts have also been used in open flow systems. Viets (*AIAA J.* 13 1975) induced spontaneous oscillations in a free rectangular jet by exploiting the concept of a flip-flop actuator and more recently, Raman and Cornelius (*AIAA J.* 33 1995) used two such jets to impose time harmonic oscillations in a larger jet by direct impingement.

More recently, a number of workers have recognized the potential for MEMS (micro eclectro mechanical systems) actuators in flow control applications for large scale systems and have exploited these devices in a variety of configurations. One of a number of examples of work in this area is that of Ho and his co-investigators (e.g., Liu, Tsao, Tai, and Ho, 1994) who have used MEMS versions of 'flaps' to effect flow control. These investigators have opted to modify the distribution of streamwise vorticity on a delta wing and thus the aerodynamic rolling moment about the longitudinal axis of the aircraft.

Background Technology for Synthetic Jets

It was discovered at least as early as 1950 that if one uses a chamber bounded on one end by an acoustic wave generating device and bounded on the other end by a rigid wall with a small orifice, that when acoustic waves are emitted at high enough frequency and amplitude from the generator, a jet of air that emanates from the orifice outward from the chamber can be produced. See, for example, Ingard and Labate, Acoustic Circulation Effects and the Nonlinear Impedance of Orifices, The Journal of the Acoustical Society of America, March, 1950. The jet is comprised of a train of vortical air puffs that are formed at the orifice at the generator's frequency.

The concern of scientists at that time was only with the relationship between the impedance of the orifice and the "circulation" (i.e., the vortical puffs, or vortex rings) created at the orifice. There was no suggestion to combine or operate the apparatus with another fluid stream in order to modify the flow of that stream (e.g., its direction). Furthermore, there was no suggestion that following the ejection of each vortical puff, a momentary air stream of "make up" air of equal mass is drawn back into the chamber and that, as a result, the jet is effectively synthesized from the air outside of the chamber and the net mass flux out of the chamber is zero. There was also no suggestion that such an apparatus could be used in such a way as to create a fluid flow within a bounded (or sealed) volume.

Such uses and combinations were not only not suggested at that time, but also have not been suggested by any of the ensuing work in the art. So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

Vectoring of a Fluid Flow

Until now, the direction of a fluid jet has chiefly been controlled by mechanical apparatus which protrude into a jet flow and deflect it in a desired direction. For example, aircraft engines often use mechanical protrusions disposed in jet exhaust in order to vector the fluid flow out of the exhaust nozzle. These mechanical protrusions used to vector flow usually require complex and powerful actuators to move them. Such machinery often exceeds space constraints and often has a prohibitively high weight. Furthermore, in cases like that of jet exhaust, the mechanism protruding into the flow must withstand very high temperatures. In addition, large power inputs are generally required in order to intrude into the flow and change its direction. For all these reasons, it would be more desirable to vector the flow with little or no direct intrusion into the flow. As a result, several less intrusive means have been developed.

Jet vectoring can be achieved without active actuation using coanda effect, or the attachment of a jet to a curved (solid) surface which is an extension one of the nozzle walls (Newman, B. G. "The Deflexion of Plane Jets by Adjacent Boundaries-Coanda Effect," Boundary Layer and Flow Control v. 1, 1961 edited by Lachmann, G. V. pp. 232–265.). However, for a given jet momentum, the effect is apparently limited by the characteristic radius of the curved surface. The effectiveness of a coanda surface can be enhanced using a counter current flow between an external coanda surface and a primary jet. Such a system has been used to effect thrust vectoring in low-speed and high-speed jets by Strykowski et al. (Strykowski, P. J, Krothapalli, A., and Forliti D. J. "Counterflow Thrust Vectoring of Supersonic Jets," AIAA Paper No. 96-0115, AIAA 34th Aerospace Sciences Meeting, Reno, Nev., 1996.).

The performance of coanda-like surfaces for deflection of jets can be further improved by exploiting inherent instabilities at the edges of the jet flow when it is separated from the surface. It has been known for a number of years that substantial modification of shear flows can result from the introduction of small perturbations at the boundaries of the shear flow. This modification occurs because the shear flow is typically hydrodynamically unstable to these perturbations. Such instability is what leads to the perturbations' rapid amplification and resultant relatively large effect on the flow. This approach has been used in attempts to control separating flows near solid surfaces the flow typically separates in the form of a free shear layer and it has been shown that the application of relatively small disturbances near the point of separation can lead to enhanced entrainment of ambient fluid into the layer. Because a solid surface substantially restricts entrainment of ambient fluid, the separated flow moves closer to the surface and ultimately can reattach to the surface. This effect has been used as a means of vectoring jets near solid surfaces. See e.g., Koch (Koch, C. R. "Closed Loop Control of a Round Jet/Diffuser in Transitory Stall," PhD. Thesis, Stanford University, 1990) (using wall jets along in a circular diffuser to effect partial attachment and thus vectoring of a primary round jet).

Similar to mechanical deflectors, technologies that rely on coanda surfaces are limited because of the size and weight of the additional hardware clearly, a coanda collar in aerospace applications must be carried along at all times whether or not it is being used.

Fluidic technology based on jet-jet interaction has also been used for flow vectoring or producing oscillations of free jets. Fluidic actuators employing control jets to affect a primary jet of the same fluid within an enclosure that allows for inflow and outflow have been studied since the late 1950's. These actuators perform a variety of "analog" (e.g., proportional fluidic amplifier) and "digital" (e.g., flip-flop) throttling and control functions in flow systems without moving mechanical parts (Joyce, 1983). In the "analog" actuator, the volume flow rate fraction of two opposite control jets leads to a proportional change in the volume flow rate of the primary stream out of two corresponding output ports. The "digital" actuator is a bistable flow device in which the control jets and Coanda effect are used to direct the primary stream into one of two output ports.

These approaches have also been employed in free jets. Viets (1975) induced spontaneous oscillations in a free rectangular jet by exploiting the concept of a "flip-flop" actuator. More recently, Raman and Cornelius (1995) used two such jets to impose time harmonic oscillations in a larger jet by direct impingement. The control jets were placed on opposite sides of the primary jet and could be operated in phase or out of phase with each other.

Use of a fluidic jet to vector another flow, while known for years, has been used with limited success. In particular, the only way known to vector a jet with another jet (dubbed a "control jet") of the same fluid was to align the control jet so that it impinges directly on the primary jet. Obviously, this involved injection of mass into the flow and has not been deemed very effective at vectoring the primary flow because it relies on direct momentum transfer between the jets for altering the direction of the primary jet. Direct momentum transfer is not economical in general and undesirable when the available power is limited (such as on board an aircraft). Furthermore, such control hardware is difficult and expensive to install because of the complex plumbing necessary to supply the control jet with fluid to operate.

Modification of Fluid Flows About Aerodynamic Surfaces

The capability to alter the aerodynamic performance of a given airframe by altering its shape (e.g., the "camber" of an airfoil) during various phases of the flight can lead to significant extension of the airframe's operating envelope. Geometric modification of lifting surfaces has so far been accomplished by using mechanical flaps and slats. However, because of the complex control system required, such devices are expensive to manufacture, install and maintain. Furthermore, flap systems not only increase the weight of the airframe, but also require considerable interior storage space that could be used for cargo, and additional ancillary hardware (e.g., hydraulic pumps, piping, etc.). In some applications, the weight penalty imposed by the flaps may more than offset their usefulness.

In addition to the use of mechanical flaps, there has been considerable effort to enhance the aerodynamic performance of lifting surfaces by delaying flow separation and thus the loss of lift and increase in drag. Conventional methods for such flow control have primarily focused on delay of separation or inducement of reattachment by introducing small disturbances into the upstream wall boundary layer. Excitation methods have included external and internal acoustic excitation (Huang, Maestrello & Bryant, Expt. Fl. 15 1987), vibrating flaps (e.g., Neuberger & Wygnanski, USAF A TR-88 1987) and unsteady bleeding or blowing (e.g., Sigurdson & Roshko, AIAA 1985, and Seifert, Bachar, Koss, Shepshelovich & Wygnanski, AIAA J. 31 1993). These methods have been used with varying degrees of success. The effectiveness largely depends on the receptivity of the boundary layer to excitation within a relatively narrow bandwidth.

Other efforts of designers to modify the flow about an aerodynamic surface have centered on injection of energy into the boundary layer of the flow in order to augment lift, reduce drag, delay turbulent onset, and/or delay flow separation. For example, the method disclosed by U.S. Pat. No. 4,802,642 to Mangiarotty involves the retardation of a flow's transition to turbulence. However, this prior art does not and cannot change the effective aerodynamic shape of the airfoil. That is, the apparatus cannot change the direction of flow of the freestream fluid about the surface. Instead, the a apparatus propagate s acoustic excitation above the Tollmien-Schlichting frequency in an attempt to disrupt Tollmien-Schlichting waves as they begin to form and thereby delay the onset of turbulence. Although this method changes the drag characteristic of a lifting surface, the mean velocity field and thus apparent aerodynamic shape of the surface remain unchanged.

Such devices as slots and fluid jets have also been extensively employed to inject energy into the boundary layer in order to prevent flow separation. Recently, efforts have turned to the use of piezoelectric or other actuators to energize the boundary layer along an aerodynamic surface. See, e.g., U.S. Pat. No. 4,363,991 to Edleman. These techniques, which employ acoustic excitation, change the surface aerodynamic performance by suppressing the naturally occurring boundary layer separation. This method requires the flow state to be vulnerable to specific disturbance frequencies. Although effective at delaying flow separation, none of these devices alter the apparent aerodynamic shape or mean velocity field of a given aerodynamic surface. Even though the changes in lift and drag that are caused by separation can be somewhat restored, there is no effect before separation occurs and the locus of the stagnation points remain largely unchanged. Therefore, before the present invention, there was no way to alter the effective shape of an aerodynamic surface without the complexity, high expense, and weight penalty of mechanical flaps or slats.

Mixing of Fluids at the Small Scale Level

In a somewhat different field of study, the ability to effectively control the evolution of the shear layer between two streams of similar fluids (gas or liquid) may have great impact on the mixing between the two streams (e.g., mixing a hot exhaust plume with cold ambient air). The boundary between the two streams forms the turbulent flow region known as a "shear layer." Hydrodynamic instabilities in this shear layer induce a hierarchy of vortical structures. Mixing between the two streams begins with the entrainment of irrotational fluid from each stream by the large-scale vortical structures. These vortical structures scale with geometric features of the flow boundary (e.g., nozzle diameter of a jet, vortex generators, etc.) and they are critical to the mixing process between the two streams by bringing together in close contact volumes of fluid from each stream in a process that is referred to as entrainment. Layers of entrained fluid are continuously stretched and folded at decreasing scales by vortical structures that evolve through the action of shear and localized instabilities induced by larger vortical structures. This process continues until the smallest vortical scales are attained and fluid viscosity balances the inertial forces. This smallest vortical scale is referred to as the Kolmogorov scale. Thus, a long-held notion in turbulence is that the smallest and largest turbulent motions are indirectly coupled through a cascade of energy from the largest to successively smaller scales until the Kolmogorov scale is reached and viscous diffusion can occur. Turbulent dissipation is the process by which (near the Kolmogorov scale) turbulent kinetic energy is converted into heat as small fluid particles are deformed.

Scalar mixing (of heat or species, for example) is similar, but not identical to momentum mixing. Analogous to the Kolmogorov scale, the Batchelor scale is the smallest spatial scale at which an isoscalar particle can exist before scalar gradients are smoothed by the action of molecular diffusion. If scalar diffusion occurs on a faster scale than momentum diffusion, the Kolmogorov energy cascade breaks "packets" of scalars down into scales small enough that molecular scalar diffusion can occur (at the Batchelor scale). In this case, the Batchelor scale is larger than the Kolmogorov scale and turbulent motions persist at scales where scalar gradients have been smoothed out by diffusion. If, on the other hand, scalar diffusion occurs on a slower scale than momentum diffusion, turbulent motions stop (at the Kolmogorov scale) before the scalar gradients are smoothed out. Final mixing only occurs after laminar straining further reduces the size of the scalar layers.

There is a substantial body of literature that demonstrates that mixing in shear flows can be influenced by manipulating the evolution of the large scale eddies (vortical structures) within the flow. Because the large-scale eddies result from inherent hydrodynamic instabilities of the flow, they can be manipulated using either passive or active devices.

As noted above, although the entrainment process in turbulent shear flows is effected by the large-scale eddies, molecular mixing ultimately takes place at the smallest scales which is induced by a hierarchy of eddies of decreasing scales that continuously evolve from the largest scale eddies. Because the base flows are normally unstable at the large scales (and thus receptive to either passive or active control inputs), the traditional approach to controlling mixing at the small-scale has been indirect. Previous attempts to control small-scale mixing employing both passive and active control strategies have relied on manipulation of global two-and three-dimensional instability modes of the base flow with the objective of controlling mixing through the modification of the ensuing vortical structures.

Passive control has primarily relied on (permanent) modification of the geometry of the flow boundary. For example, mixing of jet exhaust is often enhanced by corrugating the exhaust port of a jet. This corrugation creates the appearance of a number of lobes defined by raised and recessed curves which induce counter-rotating vortices, thus promoting mixing in the direction of the exhaust flow. Other passive devices for the promotion of mixing have included small tabs that act as vortex generators. The disadvantage of such mixing devices is that their geometry is fixed and thus their effectiveness cannot be adjusted for varying flow conditions.

Conventional active control strategies overcome this deficiency because the control input can be adjusted. For example, one prior disclosure describes the manipulation of large scale eddies in a plane shear layer between two uniform streams using a small oscillating flap. However, because this approach depends on the classical cascading mechanism to transfer control influence to the scales at which molecular mixing occurs, mixing at the smallest scales in fully turbulent flows is only weakly coupled to the control input. More importantly, mixing control of this nature relies on a priori knowledge of the flow instabilities and associated eigenfrequencies of the particular flow. Specifically, this method also requires that the flow be unstable to a range of disturbances, a condition which is not always satisfied.

Clearly, more efficient control of mixing in fully turbulent shear flows might be achieved by direct (rather than hierarchical) control of both the large-scale entrainment and the small-scale mixing processes. Such a control method has, before now, not been available but is enabled by synthetic jet actuators that are the subject of the present disclosure.

Some common applications of mixing in a bounded volume are mixing in chemical lasers and mixing for chemical or pharmaceutical products. In addition to these fields, the development of methods for enhancement of mixing through manipulation of the flow in which it occurs will have a direct impact on the performance of various other technologically important systems (e.g., in bio-engineering).

Cooling of Heated Bodies

Cooling of heat-producing bodies is a concern in many different technologies. Particularly, a major challenge in the design and packaging of state-of-the-art integrated circuits in single- and multi-chip modules (MCMs) is the ever increasing demand for high power density heat dissipation. While current technologies that rely on global forced air cooling can dissipate about 4 $W/cm^2$, the projected industrial cooling requirements are 10 to 40 $W/cm^2$ and higher within the next five to ten years. Furthermore, current cooling technologies for applications involving high heat flux densities are often complicated, bulky and costly.

Traditionally, this need has been met by using forced convective cooling using fans which provide global overall cooling when what is often required in pinpoint cooling of a particular component or set of components. Furthermore, magnetic-motor-based fans have the problem of generating electromagnetic interference which can introduce noise into the system.

In applications when there is a heat-producing body in a bounded volume, the problem of cooling the body is substantial. In fact, effective cooling of heated bodies in closed volumes has also been a long standing problem for many designers. Generally, cooling by natural convection is the only method available since forced convection would require some net mass injection into the system, and subsequent collection of this mass. The only means of assistance would be some mechanical fan wholly internal to the volume. However, often this requires large moving parts in order to have any success in cooling the heated body. These large moving parts naturally require high power inputs. But, simply allowing natural convective cooling to carry heat from the body producing it into the fluid of the volume and then depending on the housing walls to absorb the heat and emit it outside the volume is a poor means of cooling.

SUMMARY OF THE INVENTION

Briefly described, the present invention involves the use of improved synthetic jet actuators for modification of fluid flow about the various aerodynamic surfaces. Particularly, the present invention is concerned with a dramatically new approach to actually altering the apparent aerodynamic shape of various solid bodies in fluid flows.

I. Construction and Operation of Synthetic Jets

The construction and operation of various synthetic jet actuators will first be described below. These actuators serve as the "hardware" for the present invention and are described in detail in a prior-filed Patent Application, Ser. No.: 08/489,490. After discussing these devices, generally, several preferred embodiments of a system for modifying fluid flow about a body or surface, using synthetic jet actuators, will be briefly discussed.

A. First Preferred Embodiment of A Synthetic Jet Actuator

A first preferred embodiment of a synthetic jet actuator comprises a housing defining an internal chamber. An orifice is present in a wall of the housing. The actuator further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. The flexible diaphragm may be actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves outward with respect to the chamber, increasing the chamber volume, ambient fluid is drawn from large distances from the orifice into the chamber. Since the vortices are already removed from the edges of the orifice, they are not affected by the ambient fluid being entrained into the chamber. As the vortices travel away from the orifice, they synthesize a jet of fluid, a "synthetic jet," through entrainment of the ambient fluid.

In addition to the basic design of a synthetic jet actuator, one may modify the design to enhance performance. This enhanced synthetic jet actuator comprises a housing defining an interior chamber and an orifice in one wall of the housing. The synthetic jet actuator has a device or mechanism for withdrawing fluid into the chamber and for forcing fluid out of the chamber through the orifice. At least one louver is attached to the housing and is aligned with an opening formed in the housing. The louver is a one-way valve and only permits fluid flow in one direction. Thus, the louver permits fluid flow either into the chamber through the opening or out of the chamber through the opening.

The operation of the enhanced synthetic jet actuator can vary greatly depending upon whether the louver permits fluid to flow into the chamber or instead only permits fluid to flow out of the chamber. If the louver permits fluid flow into the chamber, then the synthetic jet actuator is able to withdraw fluid into the chamber through a greater surface area. The force of the jet expanded by the synthetic jet actuator, however, is not decreased since all of the fluid exits the chamber through the orifice. The synthetic jet actuator with this configuration can operate at fairly high speeds. Alternatively, if the louver only permits fluid to flow out of the chamber, then the synthetic jet actuator will generate a greater fluid flow into the chamber through the orifice than the flow out of the orifice.

A synthetic jet actuator may have any suitable louver and any suitable mechanism or device for withdrawing fluid into the chamber and for forcing fluid out of the chamber. For instance, the louver may be a passive louver or an active louver, such as one whose position is at least partially controlled by a piezo-electric material. The device or mechanism may comprise a piston reciprocating within the chamber or may comprise a flexible diaphragm driven by piezo-electric actuation.

B. Second Preferred Embodiment of a Synthetic Jet Actuator

The synthetic jet actuator just described is not the only device capable of forming a synthetic jet stream. Indeed, there are several ways to build a synthetic jet actuator for use with the present invention. For example, in certain applications a constant suction synthetic jet actuator may be desirable. In this preferred embodiment, a synthetic jet actuator will typically be embedded in a body and operate through the outer surface of the body. There may be no room in the body for a piston or other volume changing means suggested by the first preferred embodiment. This second preferred embodiment provides a solution to such a potential problem.

For the second preferred embodiment of a synthetic jet actuator, there are two concentric tubular sections, or pipes, embedded in the solid body, normal to the outside surface. The outer of the two pipes is preferably connected to a source of fluid with a means for pulsing a fluid out of this pipe. The innermost of the two pipes is connected to an appropriate means for pulling fluid down this pipe from the ambient fluid above the planar surface, such as a vacuum or fluid pump. Situated such that its exit plane is slightly below the planar surface, in operation, the innermost pipe constantly pulls fluid down its length from the ambient fluid above the flat, planar surface. Meanwhile, the outer pipe is caused to pulse fluid into the ambient environment above the planar surface. Such an operation will cause a synthetic fluid jet to form above the constant suction synthetic jet actuator.

Additionally, this embodiment allows a user to tailor the net mass flux into the system caused by the synthetic jet actuator. The source of fluid could be a compressor or other source separate from the depository of the fluid drawn into the innermost pipe. One could, therefore, tailor the system to yield a net mass increase, decrease, or no net mass flux into or out of the system above the synthetic jet actuator.

II. Applications of Synthetic Jets to Modify Fluid Flow About an Aerodynamic Surface The devices capable of forming synthetic jets, and the improvement of using louvers, all have certain features common to the class of synthetic jets, which enable these devices to have novel applications for the modification of fluid flow about a solid body or surface. In particular, the present invention involves the modification of fluid flow about a body by altering the apparent aerodynamic shape of the body when the body is immersed in a fluid flow field. A brief description of the novel apparatus in process to which the present invention is directed follows:

For such an application, a synthetic jet actuator (whether of the first or second preferred embodiment variety) is preferably embedded in a solid body, or surface, with the jet orifice built into the body/surface. The interaction of the fluid flow about the body with a synthetic jet stream produced by the actuator will change the overall fluid flow field around the solid body.

In contrast to the prior art, a unique feature of synthetic jet actuators is that they can effectively modify wall-bounded shear flows by creating closed recirculating flow regimes near solid surfaces. In fact, the synthetic jet fluid actually penetrates the flow boundary layer to affect the overall flow field about the solid body. This clearly distinguishes the present invention from prior art attempts to merely energize the boundary layer. Additionally, closed flow regimes can be formed by synthetic jet actuators when the synthetic jets are placed in an embedding flow, because the jet actuators do not dispense new fluid into the flow. Thus, when synthetic jet actuators are placed near solid surfaces in wall bounded flow, they result in a change in the apparent aerodynamic shape of the surface; hence they can be exploited for modification of aerodynamic performance measures such as lift or drag.

As a simple example, for the implementation of this concept, a synthetic jet actuator can be embedded in a bluff body comprised of a cylindrical shell. In this configuration, the synthetic jet orifice could be designed to be in one of the flat, end walls of the cylindrical section. The diaphragm of the synthetic jet actuator could comprise the opposite flat, end wall of the cylindrical section. If such a body is placed in a fluid flow field with one of the blunt walls facing the fluid flow, the synthetic jet actuator will modify the aerodynamic forces on the cylindrical body by creating a low pressure region along the surface of the cylindrical section due to alteration of the fluid flow pattern about the cylindrical section. Such changes in the drag of a bluff body could be useful in applications where a bluff body moves through fluid (e.g. automotive, under water vehicles, etc.)

As another simple example, a synthetic jet actuator could be embedded in a curved surface of an elongated cylindrical section in a region of fluid flow. The effect of this would be to modify the aerodynamic shape of the cylinder in the flow field. The synthetic jet actuator embedded in this cylindrical "airfoil" creates a permanent recirculation region near the jet orifice. Such a recirculation region modifies both the flow field and pressure distribution around the cylinder, thereby modifying both lift and drag characteristics of the surface.

As discussed above, the synthetic jet actuator actually penetrates the boundary layer which forms along the cylinder surface and thereby globally modifies the streamlines of the flow. Similarly, placement of synthetic jet actuator arrays at varying positions along the curved surface of a cylindrical section can result in displacement of its front and rear stagnation points and changes in its apparent shape, thereby altering the lift and drag characteristics of the cylinder at the same time.

The preferred embodiment for the present invention is use of one or more synthetic jet actuators to modify the aerodynamic shape of a lifting surface in a flow field. Such a lifting surface will typically comprise a wing or rotor blade. A synthetic jet actuator embedded in a solid lifting surface creates a permanent recirculation region near the jet orifice. Such a recirculation region modifies both the flow field and pressure distribution around the aerodynamic lifting surface thereby modifying both lift and drag characteristics of the surface.

In particular, because the aerodynamic characteristics of an airfoil depend critically on the location of its front and rear stagnation points and on its camber and thickness, these characteristics can be altered by synthetic jet actuators without the use of movable flaps. Placement of jet arrays and the creation of closed recirculating flow regions along the leading and trailing edges and along the upper and lower surfaces of an airfoil can result in displacement of its front and rear stagnation points and changes in its apparent thickness and camber, respectively. Addressable jet arrays can also be used to dynamically tailor and optimize the aerodynamic performance preventing premature flow separation and thus loss of lift. Additional control is achieved by using arrays of jets and vectoring flow.

An application of this invention will improve the efficiency of aircraft at various flight regimes. Typically, an aircraft wing is designed for optimum performance at the primary mission flight regime. As a consequence, the efficiency of the aircraft suffers in other regimes. However, with the present invention, synthetic jet arrays can be tailored to alter the aerodynamic shape of the wing during inefficient flight regimes in order to dramatically improve the aircraft efficiency.

In another aspect, the present invention also relates to the modification of solid surfaces of internal flows (e.g. nozzles, ducts, etc.) for mixing a fluid traveling in a downstream direction. An example of such application is a "mixer apparatus" comprises a cylindrical tubular structure having an inner surface with a circular cross-section. A plurality of synthetic jet actuators are arrayed about the circular cross-section of the cylindrical tubular structure. Each of the synthetic jets comprises an orifice formed in an inner surface of the tubular structure and a device or mechanism for withdrawing fluid into the orifice and then for forcing fluid out of the orifice. Just as with the applications described above, the synthetic jets alter an aerodynamic surface of the structure so that the structure has a lobed cross-section. The lobed cross-section is desirable since it promotes mixing of the fluid by generating vortices. This device takes advantage of the features discussed above with regard to using synthetic jet actuators in wings or cylindrical sections. In all cases, the streamlines of the flow field about a solid surface are globally altered by the synthetic jet stream.

In the preferred embodiment of the "mixer apparatus," the apparatus comprises three sets of synthetic jets arrayed about the circumference of the tubular structure. Each set of jets alters the aerodynamics of the structure to have a lobed cross-section for promoting mixing. The sets of jets are operated in succession whereby the lobed cross-section rotates about the circumference of the tubular structure thereby further promoting mixing.

The specific applications described above of the two preferred embodiments for synthetic jet actuators are not the only applications of the invention disclosed herein. Synthetic jet actuators could also be used in a similar manner to modify the throat area of a diffuser nozzle, to modify the area of a jet engine inlet or exit, or to modify the apparent aerodynamic shape of a variety of objects in mean fluid flow regimes. Furthermore, the ability of a synthetic jet actuator to create a low pressure region in the area of its orifice could also be exploited advantageously in various other flow-altering embodiments.

It is important that synthetic jet actuators are synthesized from the working fluid of the flow system in which they are employed. This feature obviates the need for expensive and bulky input piping and complex fluidic packaging. These attributes of zero net mass flux synthetic jet actuators also make them ideally suited for low-cost batch fabrication. This is in stark contrast to the prior art usage of flaps or slats to change the flow about an aerodynamic surface.

Other features and advantages will become apparent to one with skill in the art upon examination of the following drawings and detailed description. All such additional features and advantages are intended to be included herein within the scope of the present invention, as is defined by the claims.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims.

I. Synthetic Jet Actuator Hardware

A. First Preferred Embodiment

Figure 1A:
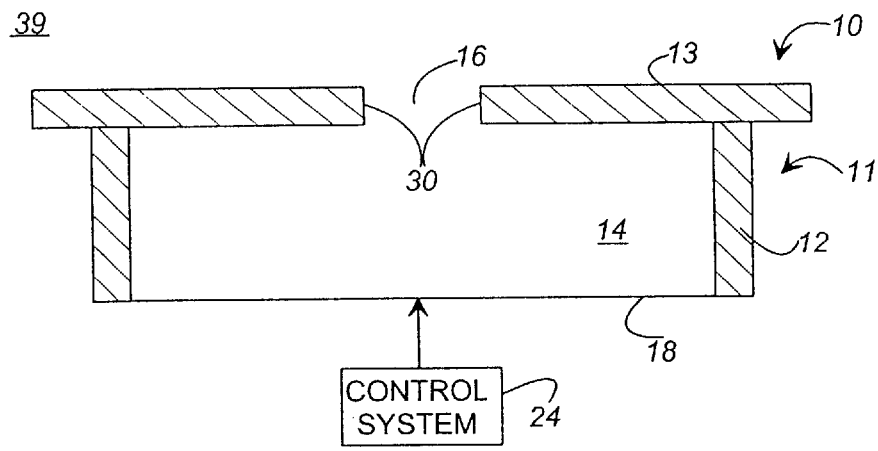
FIG. 1A is a schematic cross-sectional side view of a zero net mass flux synthetic jet actuator with a control system.

FIG. 1A depicts a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

Alternatively, a piezoelectric actuator could be attached to the diaphragm 18. The control system would, in that case, cause the piezoelectric actuator to vibrate and thereby move the diaphragm 18 in time-harmonic motion. The method of causing the diaphragm 18 to modulate is not limited by the present invention.

Figure 1B:
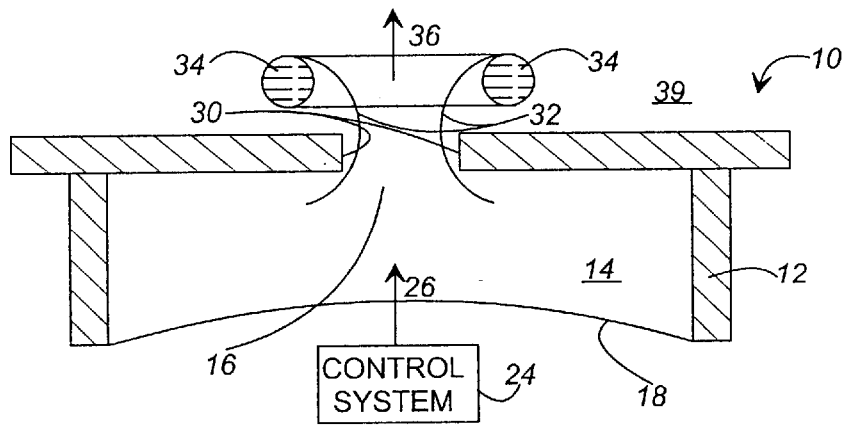
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
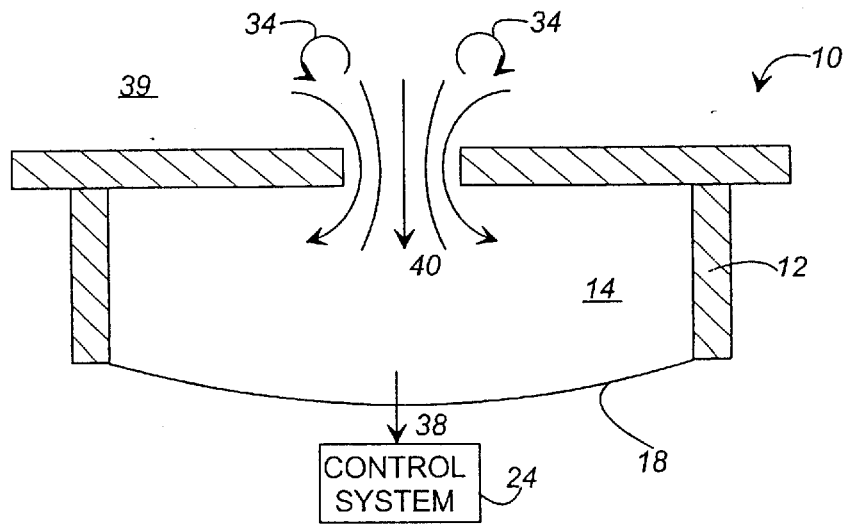
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

B. Modification of the First Preferred Embodiment: Synthetic Jets with Louvers In the first preferred embodiment, the synthetic jet actuator 10 had a flexible diaphragm 18 for forcing fluid into and out of a chamber 14. The flexible diaphragm 18 is described as being controlled by a control system 24 which may comprise, inter alia, a processor or logic circuitry. The synthetic jet actuator, however, is not limited to the use of just a flexible diaphragm. For instance, in some applications, a moveable piston head may be preferred. In these applications, the piston head would be positioned within the chamber 14 opposite the orifice 16 and would be moved by any suitable mechanism, such as a piston rod, so as to reciprocate within the chamber 14.

As opposed to the flexible diaphragm 18, the piston head would be able to move a larger mass of fluid and thus be able to produce fluid flows having larger momentums. With these stronger fluid flows, the synthetic jet actuator 10 in turn may operate more effectively in vectoring primary fluid flows, in altering aerodynamic surfaces, in promoting mixing of fluids, and in aiding heat transfer to or from a fluid. The use of a piston rather than the flexible diaphragm 18 will have other advantages and benefits which will be apparent to those skilled in the art.

A synthetic jet actuator, such as actuator 10 shown in FIGS. 1A to 1C, can be modified to operate more efficiently at very high speeds. At a very high speed, after the fluid is forced out of the chamber 14 through the orifice 16, the diaphragm 18 or piston then quickly begins to move away from the orifice 16 and attempts to draw fluid back into the chamber 14. A limitation on the withdrawal of fluid back into the chamber 14 can decrease the force of the jet 36 and the effectiveness of the jet actuator 10. Furthermore, if the fluid is compressible, the quick retraction of the flexible diaphragm 18 creates a vacuum within the chamber 14. As a result, the fluid that is drawn into the chamber 14 has less mass than that previously forced out of the chamber 14 and the subsequent jet 36 will, consequently, have less momentum. The inability to force an adequate mass of fluid into the chamber 14 therefore decreases the effectiveness of the jet actuator 10.

Figure 17A:
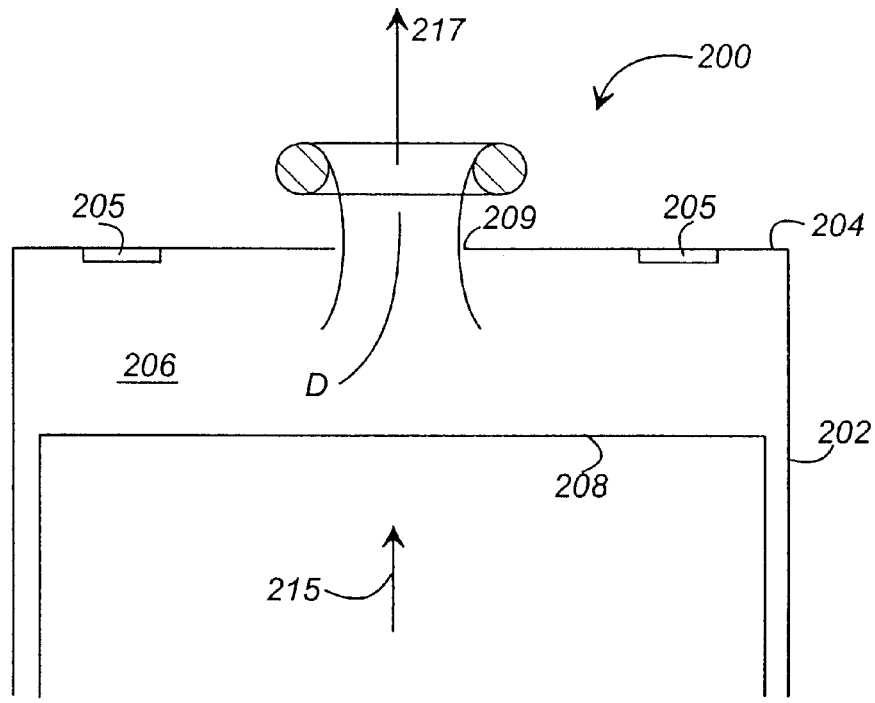
FIG. 17A is a schematic cross-sectional side view of a synthetic jet actuator having a pair of outwardly-opening louvers in a closed position while a piston moves away from an orifice.
Figure 17B:
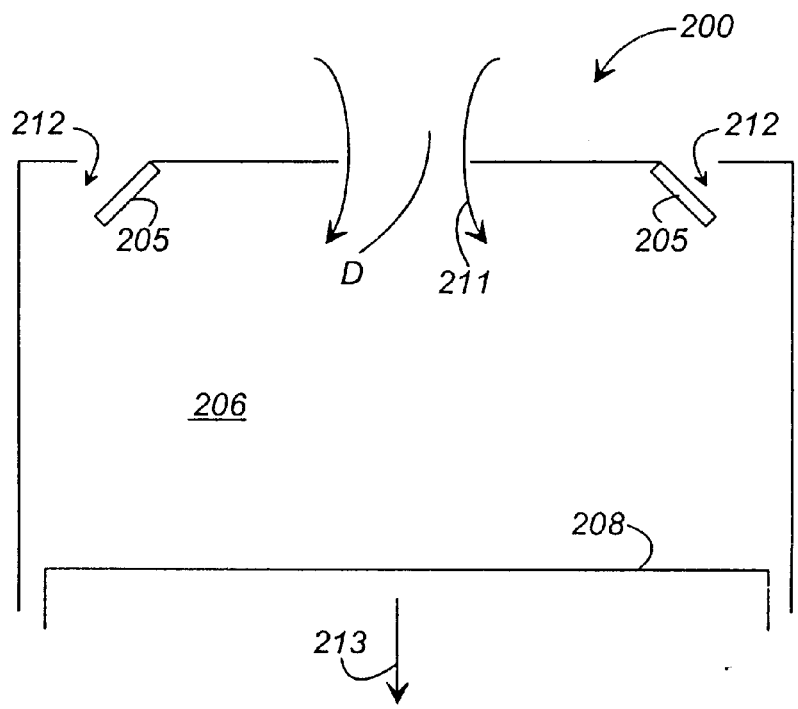
FIG. 17B is a schematic cross-sectional side view of the synthetic jet actuator of FIG. 17A illustrating the louvers in an open position while the piston moves toward the orifice.

A synthetic jet actuator 200 which can effectively operate at high speeds is shown in FIGS. 17A and 17B and comprises a housing 202 defining an interior chamber 206. The housing 202 has an upper wall 204 with an orifice 209 and at least one louver 205. In the preferred embodiment, the jet actuator 200 preferably has a plurality of louvers 205. Only two louvers 205 have been shown in the figures in order to simplify the description. The synthetic jet actuator 200 also comprises a piston head 208 for reciprocating toward and away from the orifice 209 at a prescribed rate and stroke distance. The invention is not limited to any particular stroke distance or rate whereby the rate and stroke distance may be adjusted according to the particular needs of an application.

FIG. 17A illustrates the jet actuator 200 at a time when the piston 208 is moving toward the orifice 209. As shown in the figure, the louvers 205 are in a closed position whereby a fluid flow 217 is forced out only through the orifice 209. The jet 217 produced by the jet actuator 200 is similar to the jet 36 produced by the jet actuator 10 and produces vortex sheets which roll into vortices and move away from the orifice 209.

With reference to FIG. 17B, the louvers 205 open during the time that the piston 208 moves away from the orifice 209. With the louvers 205 opened, fluid may enter the chamber 206 not only through the orifice 209 in flow 211 but also through the openings adjacent to the louvers 205 in flows 212. These additional fluid flows 212 substantially increase the surface area by which fluid may enter the jet actuator 200 and enable the jet actuator 200 to force a sufficient amount of fluid into the chamber 206 while the piston 208 moves away from the orifice 209. Since the jet actuator 200 is able to intake sufficient amounts of fluid within the chamber 206, the jet actuator 200 is able to maintain the momentum of the fluid flow 217 in subsequent strokes of the piston 208.

Figure 18A:
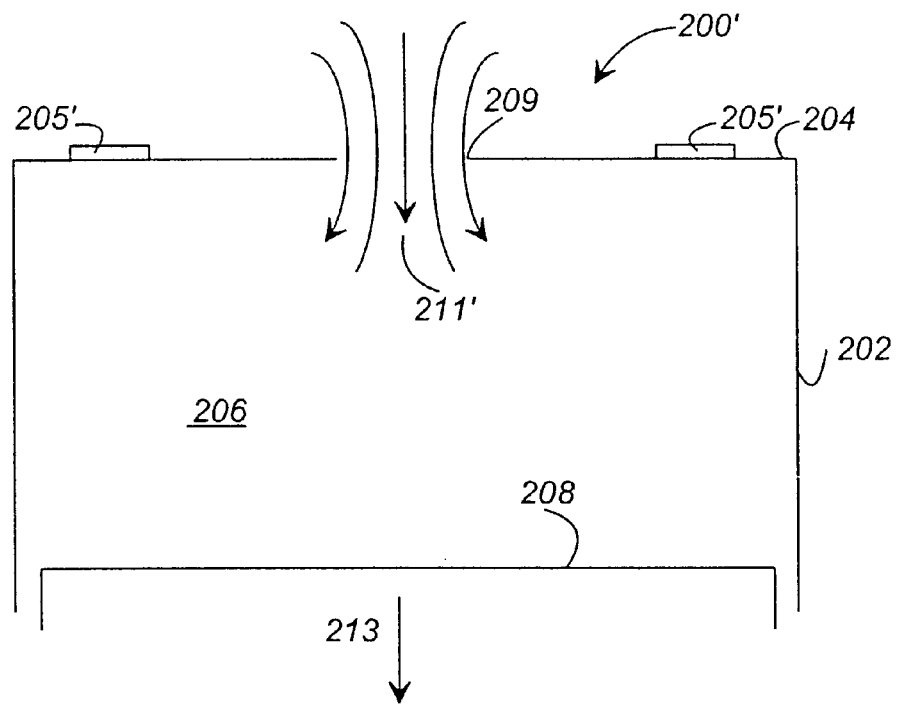
FIG. 18A is a schematic cross-sectional side view of a synthetic jet actuator having a pair of inwardly-opening louvers placed in a closed position while a piston moves toward an orifice.
Figure 18B:
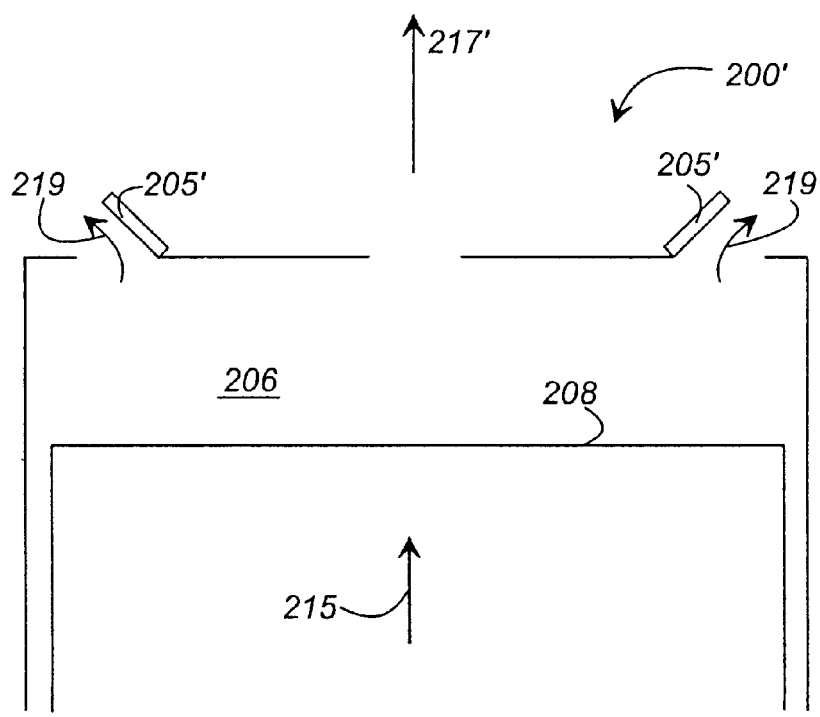
FIG. 18B is a schematic cross-sectional side view of the synthetic jet actuator of FIG. 18A illustrating the louvers in an open position while the piston moves away from the orifice.

In some applications, a fluid flow with larger momentum 211 into the chamber 206 of the jet actuator 200 and a smaller flow out of the orifice 209 may be desirable. FIGS. 18A and 18B illustrate a jet actuator 200' which has a plurality of louvers 205' which become opened while the piston 208 moves toward the orifice 209 and become closed while the piston 208 moves away from the orifice 209. As a result, during the down stroke of the piston 208, as shown in FIG. 18A, a large fluid flow 211' is forced through the orifice 209. During the up stroke of the piston 208, on the other hand, the louvers 205' become opened and fluid is permitted to exit the chamber 206 not only through orifice 209 in flow 217' but also through the openings adjacent louvers 205' in flows 219. Since the fluid has a greater surface area in which to exit the chamber 206, the momentum of the flow 217' is substantially decreased.

As should be apparent from FIGS. 17A, 17B, 18A, and 18B, the amount of fluid that is drawn into the chamber 206 or which is forced out of the chamber 206 may be altered by using one or more louvers. With the jet actuator 200, the louvers 205 increase the amount of fluid that enters the chamber 206 while the louvers 205' in jet actuator 200' decrease the momentum of the jet 217' exiting the orifice 209. By adjusting the size and number of the openings covered by the plurality of louvers, the flow rates in and out of the chamber 206 may be altered.

Alternate Types of Louvers

The louvers in a synthetic jet actuator are one-way valves that permit fluid flow in one direction but which block flow in the opposite direction. As shown above in synthetic jet actuators 200 and 200', the louvers can permit fluid flow either into the chamber 206 or out of the chamber 206. The invention can be implemented with any suitable type of louver, such as either an active louver or a passive louver. A passive louver is simply a flap or valve which is hinged so as to open with fluid flow in one direction and which closes tight against the housing 202 of the jet actuator with fluid flow in the opposite direction.

Figure 20A:
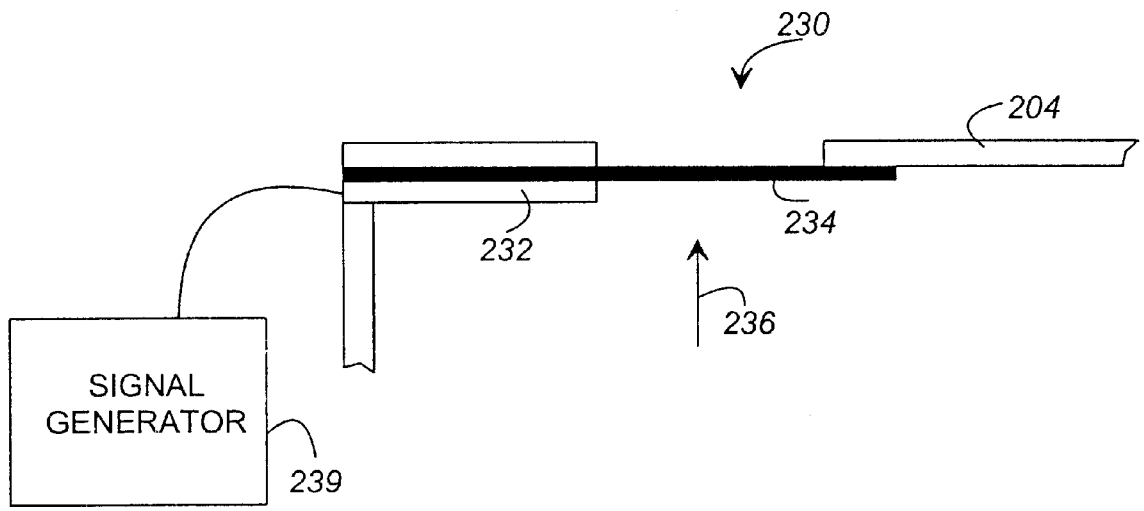
FIG. 20A is a schematic cross-sectional side view of an active louver in a closed position.
Figure 20B:
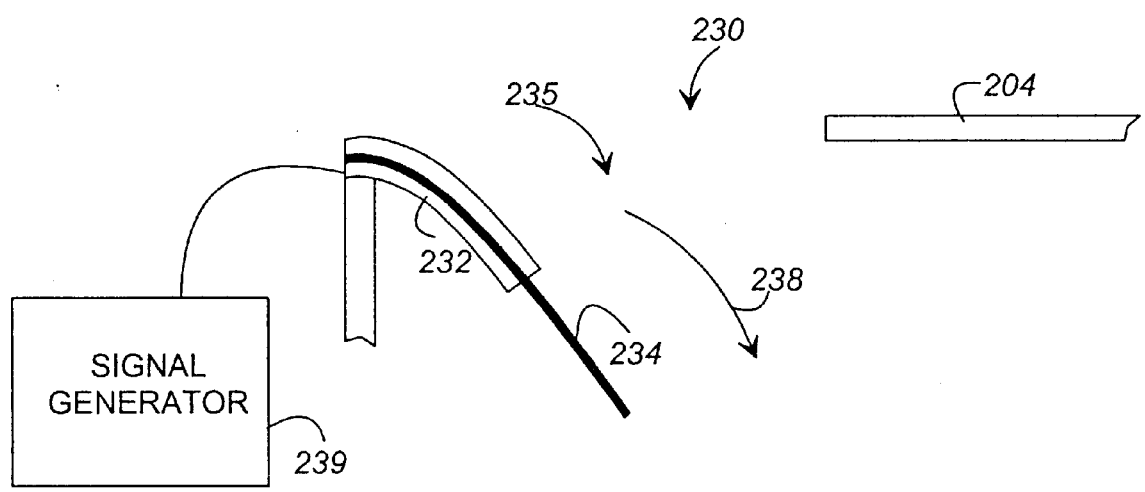
FIG. 20B is a schematic cross-sectional side view of the active louver of FIG. 20A in an open position.

An active louver, such as louver 230 shown in FIGS. 20A and 20B, becomes opened or closed with the assistance of a force other than just the force of a fluid flow. In the example shown in FIGS. 20A and 20B, this other force may be generated by a piezo-electric material 232. With reference to FIG. 20A, when the louver 230 is in a closed state, a semi-rigid member 234 is in intimate contact with wall 204 of the synthetic jet actuator. The semi-rigid member 234 preferably overlaps a portion of the wall 204 so that the louver 230 remains in a closed state even when a fluid flow 236 contacts the louver 230. As is known to those skilled in the art, the piezo-electric material 232 will deflect upon the application of an electrical signal. Thus, an electrical signal can be applied to the piezo-electric material 232 from a signal generator 239 to cause the piezo-electric material to deflect down to an open state shown in FIG. 20B. In the open state, a fluid flow 238 is permitted to travel through an opening 235 and exit the chamber or, as depicted in this example, enter the chamber. The exact manner in which an electrical signal is applied to the piezo-electric material 232 is known to those skilled in the art and, accordingly, has been omitted from the drawings in order to simplify the description of the invention.

C. Second Preferred Embodiment:
    Constant Suction Synthetic Jet Actuator

Figure 31:
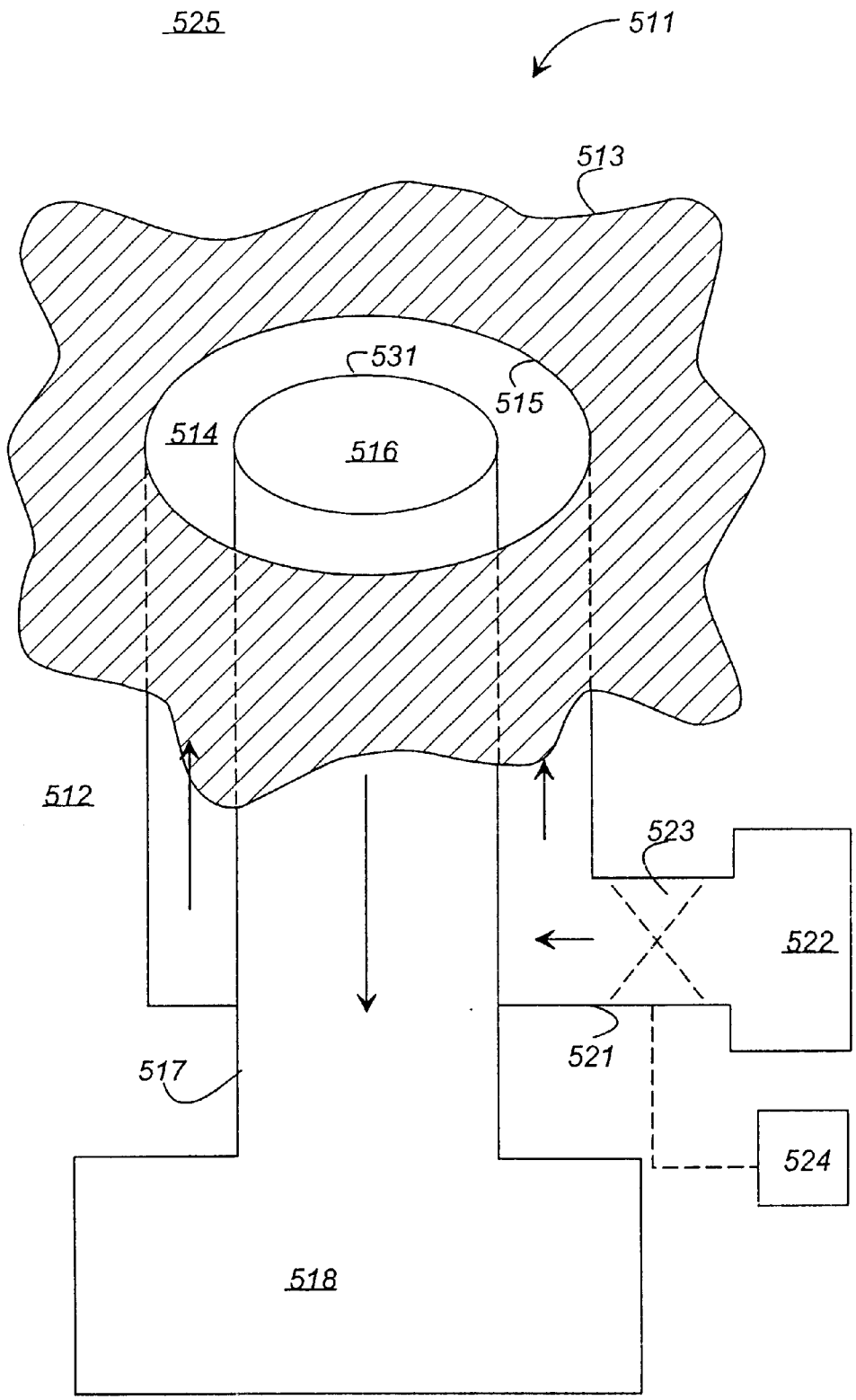
FIG. 31 is a cut-away perspective view of a second embodiment of a synthetic jet producing device

The preferred embodiment for a constant suction synthetic jet actuator 511, a further improvement on the class of synthetic jet actuators, is depicted in FIG. 31. A constant suction synthetic jet 511 is particularly useful for the application of embedding a synthetic jet actuator into a solid body 512. The preferred embodiment 511 is comprised of an outer cylindrical section 514 made similar to a pipe, and an inner cylindrical section 516. Although not limited to such an embodiment, the outer cylindrical section 514 and the inner cylindrical section 516 as depicted in FIG. 31 are concentric and approximately perpendicular to the outer surface 513 of the solid body 512. Additionally, the outer cylindrical section 514 is embedded into the solid body 512 such that an upper rim 515 of the outer section is contiguous with the outer surface 513. By contrast, the inner cylindrical section 516 has an upper rim 531 which is some small distance below the outer surface 513 of the solid body 512. The particular diameters given to the outer cylindrical section 514 and the inner cylindrical section 516 are not critical to the present invention.

The outer cylindrical section 514 should preferably be connected by fluidic piping 521 to a fluid source 522. Along the path of the fluidic piping 521 is a valve 523 which permits control of the fluid flow through the fluidic piping 521. The present invention, however, is not intended to be limited to the use of a valve 523 only. Any equivalent mechanism for stopping and restarting the flow of fluid would also function adequately and is included in the present invention. In operation, the valve 523 should preferably alternately stop and then release fluid through the fluidic piping 521 and into the outer cylinder 514. This "on-off" operation is controlled by a suitable control system 524, such as a microcomputer or other logic device. The frequency at which the control system 524 causes the gate valve 523 to operate should preferably be adjustable in order to control effectively the operation of the synthetic jet actuator. A computer control system would easily provide this level of control. The inner cylindrical section 516 is preferably connected by fluidic piping 517 to a suction mechanism 518. Such a suction mechanism 518 may comprise a vacuum, a pump, or any other appropriate mechanism for providing a constant suction. As indicated by the name of this preferred embodiment, the suction mechanism 518 operates constantly during operation of the synthetic jet actuator 511 and the removed fluid can be pumped back into the blowing section.

Figure 32A:
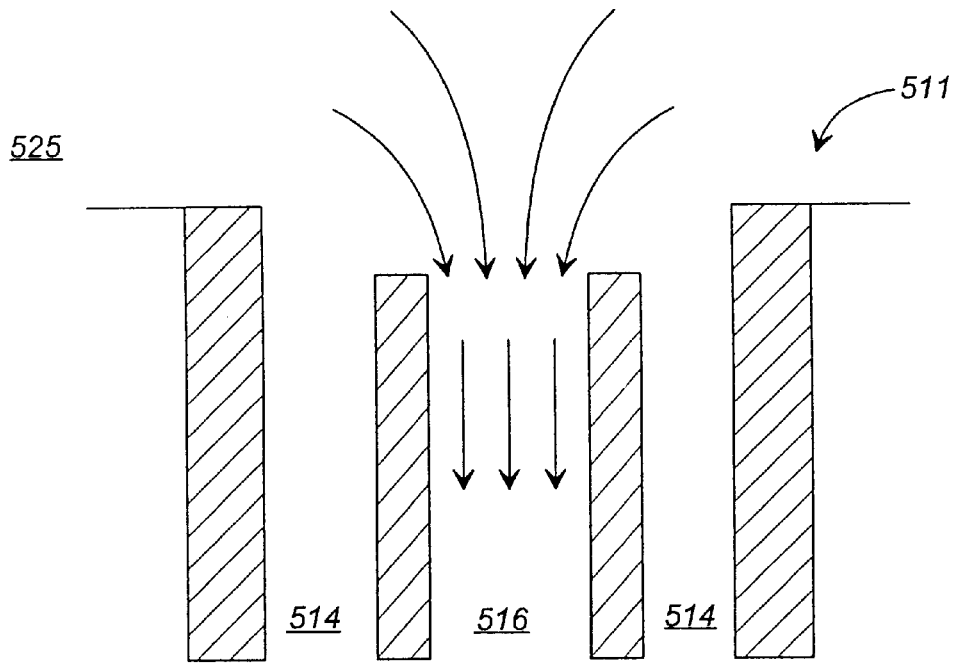
FIG. 32A is a schematic side-view of a second embodiment of a synthetic jet producing device in a first mode of operation where fluid is drawn in through the embodiment.

Therefore, in operation, the suction mechanism 518 creates a constant suction on an ambient fluid 524 above the outer surface 513 of the solid body 512. This action creates a constant flow of the ambient fluid 525 into the inner cylindrical section 516 and through the fluidic piping 517. The operation of the constant suction synthetic jet 511 when ambient fluid 525 is being pulled into the inner cylindrical section 516 is depicted in FIG. 32A. In FIG. 32A, the gate valve 523 is closed such that no fluid is ejected through the outer cylindrical section 514. This particular mode of operation is very much like the synthetic jet actuator 10 of FIGS. 1A–1C when the diaphragm or piston withdraws from the housing 11, thereby increasing the volume of the chamber 14.

Figure 32B:
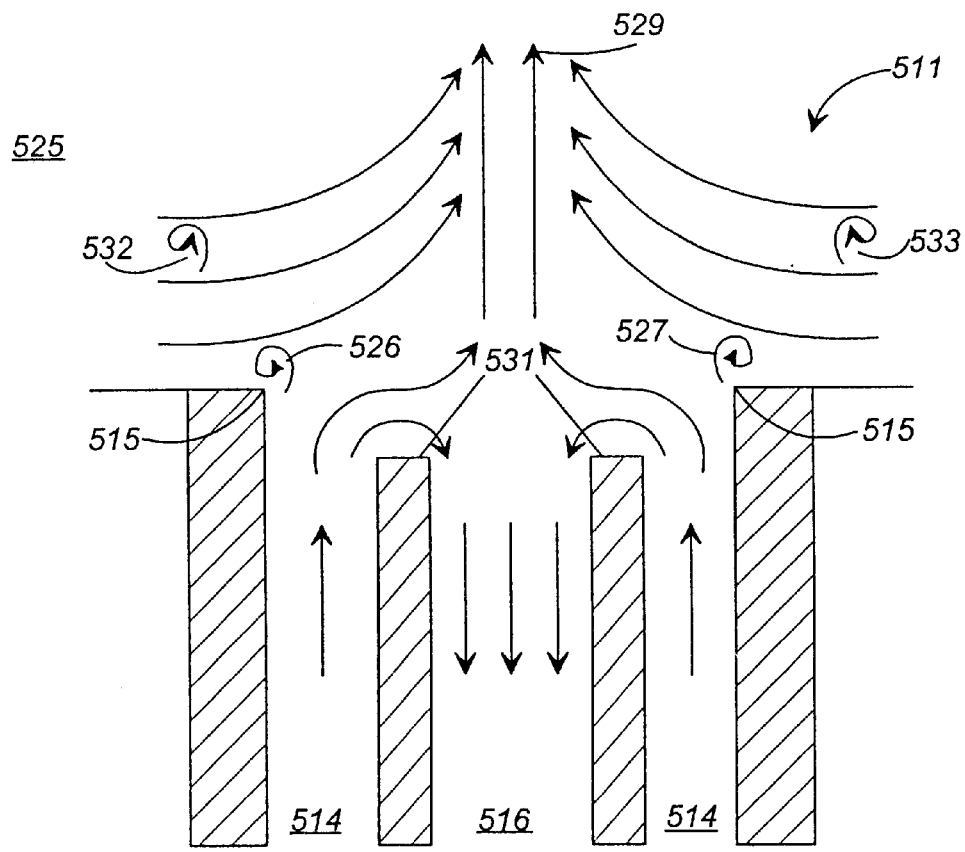
FIG. 32B is a schematic side-view of a second embodiment of a synthetic jet producing device in a second mode of operation which produces a synthetic jet stream.

FIG. 32B depicts a mode of operation of the constant suction synthetic jet 511 when the gate valve 523 is opened and fluid flows out through the outer cylindrical section 514. As the fluid goes by the upper rim 515 of the outer cylindrical section 514, vortices 526, 527 are formed, roll up, and move away. Vortices 532, 533, as depicted in FIG. 32B, have already moved a small distance away from the outer surface 513 of the body 512. The vortices 526, 527, 532, 533 entrain ambient fluid 525, as depicted by arrows 528a–528d. Thus, a synthetic jet actuator of fluid 529 is formed approximately normal to the outer surface 513 and moves away from the solid body 512.

Since the upper rim 531 of the inner cylindrical section 516 is slightly below the outer surface 513 of the solid body 512, as fluid is ejected from the outer cylindrical section 514, some of the fluid will be pulled around the upper rim 531 of the inner cylinder 516 and into the fluidic piping 517, as depicted in FIG. 32B. However, because this occurs below the outer surface 513 of the solid body 512, the formation of the vortices 526, 527 and the resulting fluid jet 529 is not affected by the constant suction.

The constant suction synthetic jet actuator 511 alternates between the mode of operation depicted in FIG. 32A and the mode of operation depicted in FIG. 32B. However, as described above with regard to the synthetic jet actuator 10 depicted in FIGS. 1A–1C, a constant jet of fluid 529 is formed above the opening in the outer surface 513 of the solid body 512.

If it is desired, the fluid source 522 for the outer cylindrical section 514 can be a storage container into which fluid from the ambient air 525 is deposited after being drawn through the inner cylinder 516 by the suction mechanism 518. In this way, zero net mass is injected into the system. This feature may be desirable in some applications. However, the present invention is not limited to such a configuration. Where it does not matter whether any mass is ejected into the system, the source of fluid 522 for the outer cylinder 514 can be any fluidic chamber or environment. In this way, the net mass flow into or out of the synthetic jet actuator of this preferred embodiment can be tailored for the specific application.

II. Synthetic Jet Actuators Modifying Fluid Flow About Various Bodies

A synthetic jet actuator of any type described above may be embedded in various solid bodies in fluid flow fields in order to effectively alter the apparent aerodynamic shape of that solid body. Synthetic jet actuators can be employed to modify either external flows or internal flows. As such, three examples of synthetic jet actuators modifying external flows will first be discussed, then an example of internal flow modification will be presented.

A. Modification of External Fluid Flows

1. Application to a Bluff Body

Figure 5A:
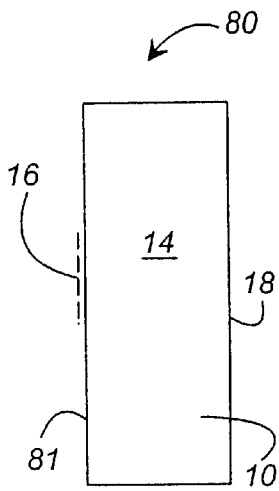
FIG. 5A is a schematic cross-sectional side view of a synthetic jet actuator embedded in a cylindrical section.

As a simple demonstration of the present invention, a synthetic jet actuator 10 may be used to modify flow about a bluff body, as depicted in FIG. 5A. In FIG. 5A, a synthetic jet actuator 10 is embedded in a cylindrical section 80. In the preferred embodiment, the walls of the cylindrical section 80 define the internal chamber 14 of the synthetic jet actuator 10. The right flat wall 18 of the cylindrical section 80 is constructed of a flexible material such that the wall 18 comprises the synthetic jet actuator diaphragm 18. In the left flat wall 81 of the cylindrical section 80, there is a small hole 16, of circular shape, comprising the synthetic jet actuator orifice 16. Although not depicted in FIG. 5A, a piezoelectric actuator is adhered to the flexible wall 18 in order to induce time-harmonic harmonic motion of this wall 18.

Although a synthetic jet actuator 10 of the first type described above is depicted in FIGS. 5A–5D, the present embodiment is not so limited. A constant suction synthetic jet actuator 511 or a synthetic jet actuator with louvers 200 may also be embedded in a bluff body, such as the cylindrical section 80, and yield equally beneficial results. In some applications, such an obvious modification to the preferred embodiment may be desirable.

Figure 5B:
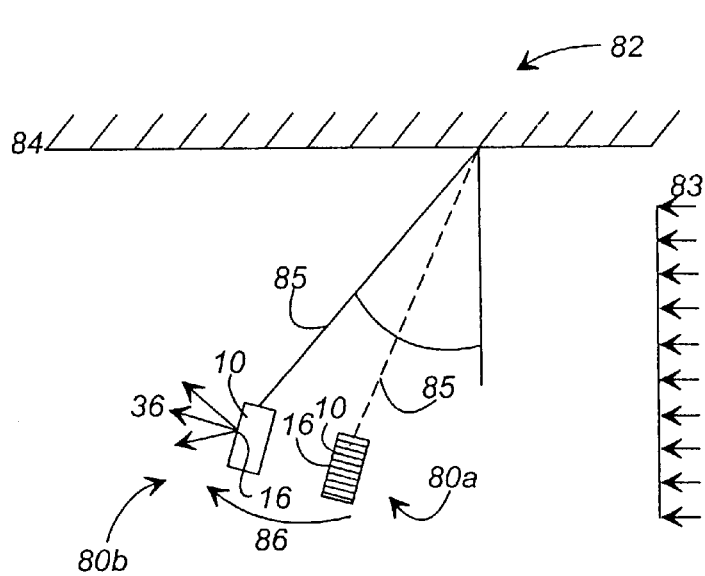
FIG. 5B is a schematic cross-sectional side view of the device in FIG. 5A mounted in a wind tunnel to show the aerodynamic effect of the synthetic jet actuator on the cylindrical section when the synthetic jet is aligned to create a flow in the same direction as the primary flow.

FIG. 5B is a schematic depiction of a test assembly (generally denoted as 82) which could be used to demonstrate modification of the aerodynamic forces on a cylindrical section (depicted by 80a and 80b) due to operation of a synthetic jet actuator 10. The shaded depiction of the cylindrical section 80a shows the position of the cylindrical section 80a with the synthetic jet actuator 10 not operational. Alternatively, the unshaded drawing of the cylindrical section 80b shows the position of the cylindrical section 80b with the synthetic jet actuator 10 activated.

In this test assembly 82, the cylindrical section 80a is submerged in a fluid stream (depicted by arrows 83) while suspended from an upper surface 84 by a wire 85. The cylindrical section 80a is positioned such that the synthetic jet orifice 16 is in the left face 81 of the cylindrical section 80a. When the synthetic jet actuator 10 is activated, the unshaded cylindrical section 80b depicts the new position of the cylindrical section 80b. The synthetic jet actuator 10 causes a fluid stream (depicted by arrows 36) to emanate from the jet orifice 16. The fluid stream 36 created by the synthetic jet actuator 10 causes the aerodynamic forces operating on the cylindrical section 80b to change from the forces acting on the cylindrical section 80a without the synthetic jet operating. This change in forces is the reason the cylindrical section 80a swings left-ward, as indicated by arrow 86, to a new position, indicated by the unshaded cylindrical section 80b.

Figure 5C:
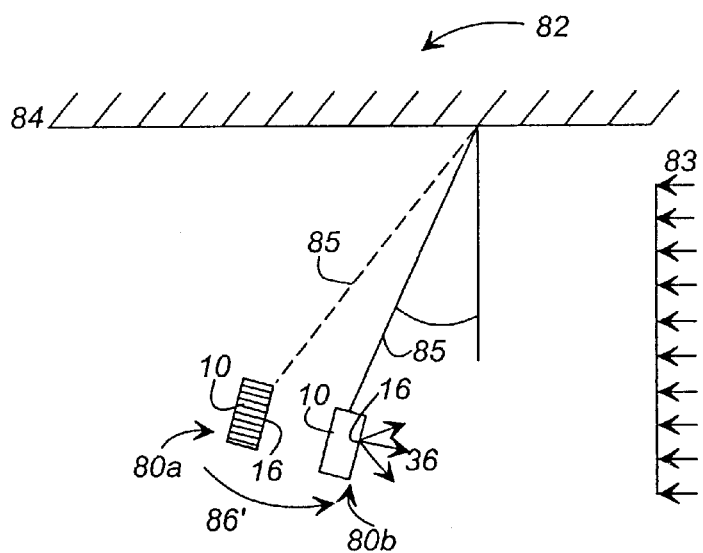
FIG. 5C is also a schematic cross-sectional side view of the device in FIG. 5A mounted in a wind tunnel to show the aerodynamic effect of the synthetic jet actuator on the cylindrical section, however in this depiction, the synthetic jet is aligned to create a flow in the opposite direction as the primary flow.

FIG. 5C depicts the same test assembly 82 as in FIG. 5B except the synthetic jet actuator orifice 16 in the cylindrical section wall 81 now faces the fluid flow 83. The shaded cylindrical section 80a depicts the position of the section 80a with the synthetic jet actuator 10 turned off and the unshaded cylindrical section 80b depicts the position of the section 80b with the synthetic jet 10 operational. When the synthetic jet actuator 10 is activated, a fluid stream 36 emanates from the jet orifice 16 and the cylindrical section (depicted by 80b after activation of the synthetic jet actuator 10) swings toward the fluid flow 83 as depicted by arrow 86'.

Figure 5D:
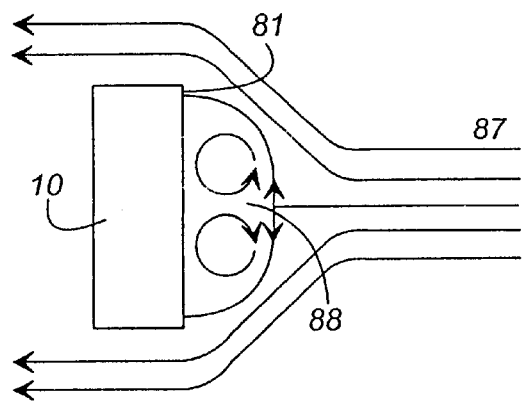
FIG. 5D is a schematic cross-sectional view of fluid flow around a cylindrical section with an operational synthetic jet actuator embedded therein.

The movement of a cylindrical section 80 placed in said test assembly 82 can best be explained by reference to FIG. 5D. In FIG. 5D, the cylindrical section 80 is depicted in a flow (with streamlines 87) with the synthetic jet actuator 10 operational. The synthetic jet actuator 10 creates a permanent recirculation region 88 on the cylindrical section wall 81. Such alteration of the apparent aerodynamic shape of the cylindrical section 80, produces a low pressure region along the cylindrical section surface 81. This redirection of the fluid flow (depicted by the streamlines 87) about the cylindrical section 80, and resulting low pressure region 88, cause the motions of the cylindrical section 80 as depicted above in FIG. 5B and FIG. 5C.

2. Application to a "Lifting Surface"

The embodiment just described is only one potential source of benefit from the invention disclosed herein. The preferred embodiment of a synthetic jet actuator embedded in a non-bluff body, though applications of this concept are not limited to this embodiment, is the use of a synthetic jet actuator 10 as means for the modification of lift and drag characteristics of an aerodynamic surface by interacting with a freestream flow across the surface. Although the preferred embodiment described below uses a synthetic jet actuator 10 of the type described in FIGS. 1A–1C, other embodiments of synthetic jet actuators may also be employed. For example, a constant suction synthetic jet actuator 511 (as in FIG. 31) or a jet actuator with louvers 200 (as in FIGS. 17A-17B) may be used with equal, or even greater, effectiveness. The present embodiment of the invention is intended to include such obvious options.

Figure 6A:
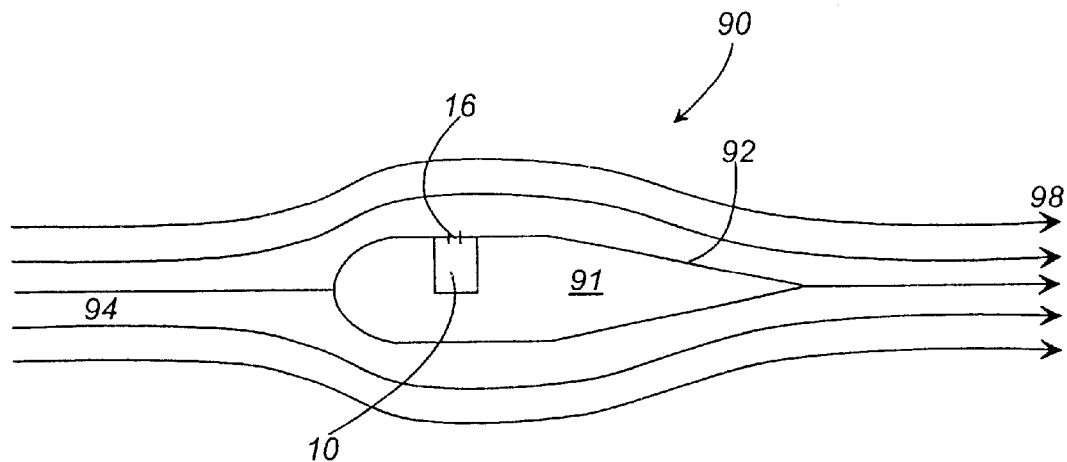
FIG. 6A is a schematic cross-sectional side view of a wing with the synthetic jet actuator of FIG. 1A embedded in the wing.

FIG. 6A depicts the preferred embodiment 90 of a synthetic jet actuator 10 used to modify the lift and drag characteristics of an aerodynamic surface 91. In this embodiment 90, a synthetic jet actuator 10 is embedded in an airfoil 91 such that the synthetic jet orifice 16 is flush with the external surface, or skin 92, of the airfoil 91. The positioning of the orifice along the airfoil skin can be determined based on the particular effect on the flow desired. The airfoil 91 is placed in a freestream of fluid, as depicted by the arrow 94. The flow of the fluid 94 about the airfoil 91 is depicted by the set of streamlines 98. As depicted, the airfoil 91 is at zero degrees angle of attack, and the airfoil 91 is symmetric about its chord line. While the embodiment depicted in FIG. 6A is at zero degrees angle of attack, the present invention also functions appropriately at other angles of attack. For example, at higher angles of attack, the separation performance of a wing can be controlled and/or tailored.

Figure 6B:
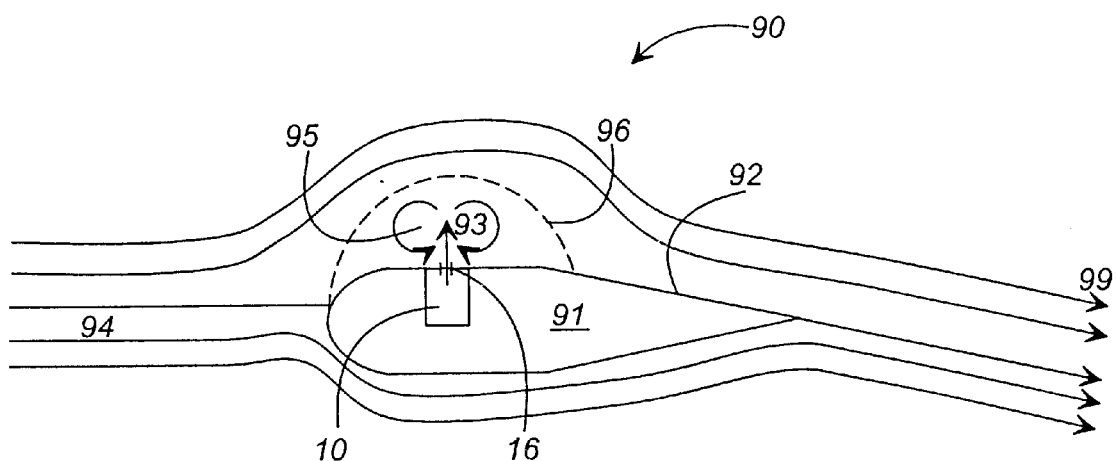
FIG. 6B is a schematic cross-sectional side view of the wing of FIG. 6A in operation showing the modification of fluid flow resulting from the synthetic jet actuator of FIG. 1A.

FIG. 6B. shows the embodiment 90 when the synthetic jet actuator 10 is operational. When the synthetic jet actuator 10 is operational, the synthetic jet actuator 10 forms a fluid flow as depicted by arrow 93 normal to the synthetic jet orifice 16 in the airfoil skin 92. Because the synthetic jet actuator 10 does not inject any new fluid into the freestream flow 94, a closed recirculating flow region 95 is formed adjacent to the airfoil skin 92. This region 95 is depicted in FIG. 6B as bounded by the broken line 96. Because this recirculating region 95 is closed, the aerodynamic shape of the airfoil surface 92 is effectively modified. The new effective shape is depicted by the airfoil skin 92 with the addition of the broken line 96, representing the closed region of flow 95. Because of the airfoil surface modification, the streamlines 99 of the freestream flow 94 will flow over the recirculating region 95, defined by the broken line 96, just as if the broken line 96 were a solid part of the airfoil skin 92. Thus, the aerodynamic characteristics of the airfoil 91 are changed by operation of the synthetic jet actuator 10.

It has been discovered by experimentation that the presence of the synthetic jet actuator 10 in the airfoil 91 causes an alteration of the static pressure distribution along the surface of the airfoil 91. The surface of the airfoil 91 just upstream of the synthetic jet actuator's recirculation region and just downstream of the recirculation region experience a decrease in static surface pressure. The surface of the airfoil 91 under the recirculation region experiences an increase in downward pressure force. However, the area experiencing an increase in static pressure is relatively small and therefore, the net lift force is augmented. In contrast, a non-synthetic jet actuator ejecting fluid normal to an airfoil in a flow field would cause a decrease in static pressure downstream of the jet orifice, but an increase in static pressure upstream of the jet orifice.

The static pressure modification caused by a synthetic jet leads naturally to the concept of "mimicking" synthetic jet performance with sources and sinks in the skin of an airfoil (or any other body). For instance, if a source and a sink are placed in the airfoil with the sink slightly upstream of the source, the effect on the freestream flow and static pressure distribution will be similar to a synthetic jet actuator embedded in the surface between the source and sink.

3. Applications in a Cylindrical Section

Another example of how the aerodynamic characteristics of a body in a fluid flow can be changed is if a synthetic jet actuator is embedded in a curved surface of a cylindrical section. Although this will not typically be the real-world application of this invention, this serves as another example of the value and effectiveness of the present system for modifying fluid flow fields about surfaces and bodies.

Figure 33B:
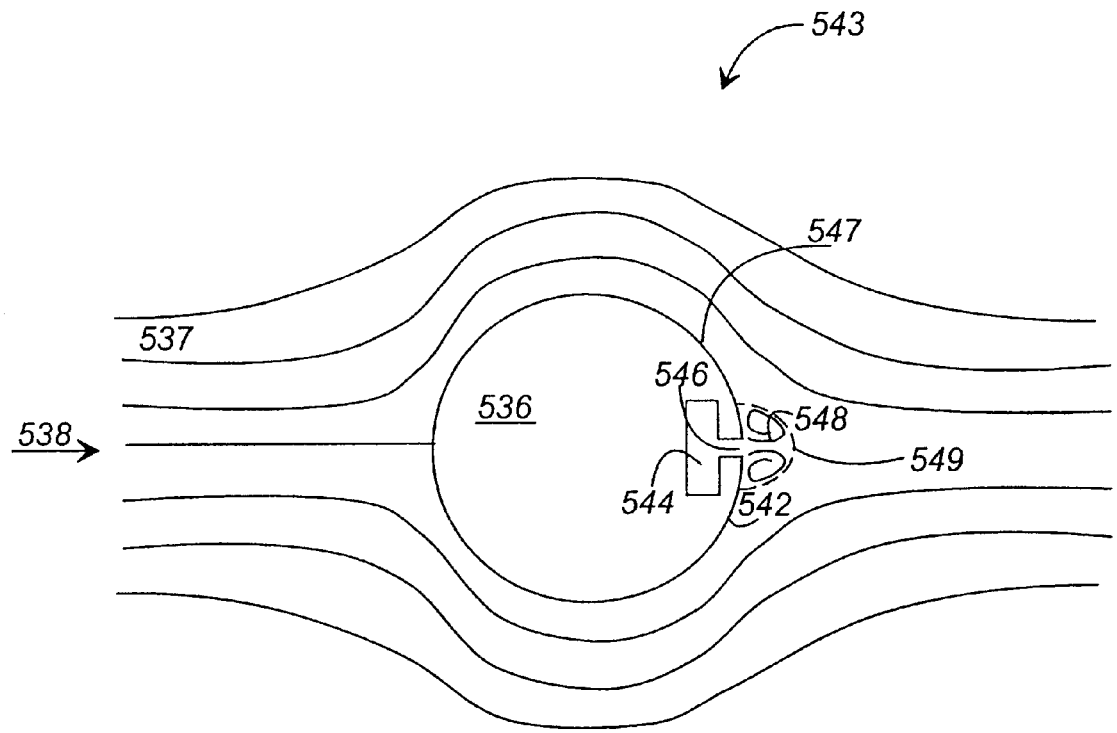
FIG. 33B is a schematic cross-sectional view of fluid flow around a cylindrical section with an operational synthetic jet actuator embedded therein and ejecting fluid 180 degrees from the impingement of the fluid flow on the section's surface.
Figure 33A:
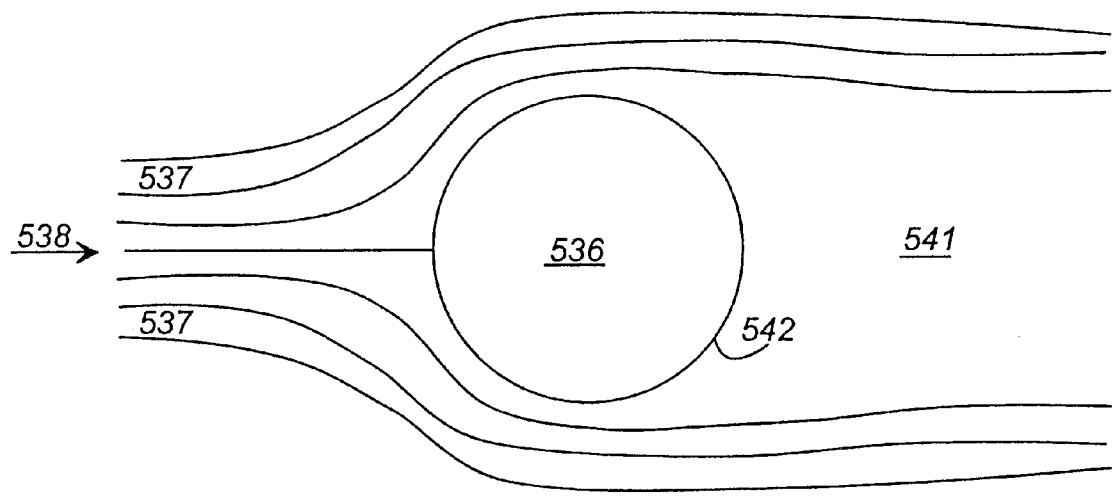
FIG. 33A is a schematic cross-sectional view of fluid flow around a cylindrical section.

FIG. 33A depicts a freestream fluid flow 538 around a cylindrical section 536 with streamlines 537. Typically, such a fluid flow 538 creates tremendous drag on the cylindrical section 536. Furthermore, no lift is created by the cylindrical section 536. Fluid flow 538 around a cylindrical section 536 is typified with a large wake 541 adjacent to a rear surface 542 of the cylindrical section 536.

In the preferred embodiment 543 depicted in FIG. 33B, a synthetic jet actuator 544 is embedded in the cylindrical section 536. The synthetic jet actuator 544 has an orifice 546 flush with the external surface 547 of the cylindrical section 536. Although the synthetic jet actuator 544 depicted in FIG. 33B is of the type described in FIGS. 1A–1C, the present invention is not limited to such a configuration. The synthetic jet actuator 544 could be of a type described in FIGS. 31–32 or a synthetic jet actuator with louvers.

FIG. 33B depicts a situation where the synthetic jet orifice 546 is positioned 180° from the impingement of the freestream flow 538 upon the cylindrical section 536. When the synthetic jet actuator 544 is operational, a fluid flow 548 is created normal to the cylindrical section outer surface 547. As outlined above, because the synthetic jet actuator 544 does not inject any new fluid into the freestream flow 538, a closed recirculating flow region 549 is formed directly adjacent to the surface 547 of the cylindrical section 536. Not only does this change the effective aerodynamic shape of the cylindrical section 536, but streamlines 537 of the freestream flow 538 are dramatically modified. Notice that the flow 538 is still separated at the rear 542 of the cylindrical section 536. However, experimental data shows that the drag on the cylindrical section 536 is dramatically reduced.

Figure 33C:
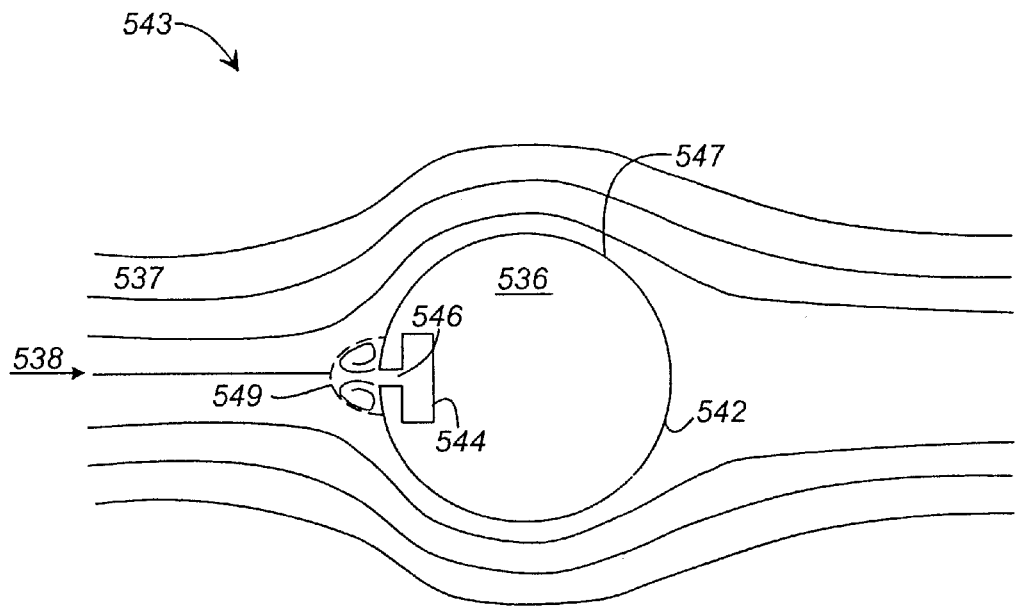
FIG. 33C is a schematic cross-sectional view of fluid flow around a cylindrical section with an operational synthetic jet actuator embedded therein and ejecting fluid in a direction opposite to the direction of the freestream fluid flow.
Figure 33D:
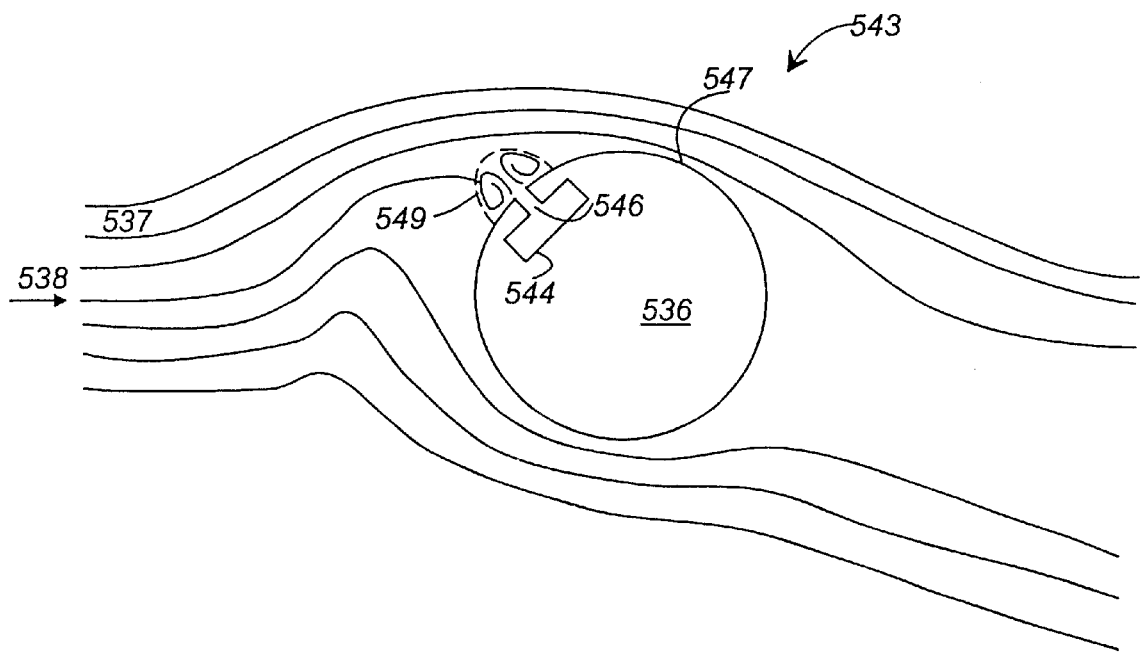
FIG. 33D is a schematic cross-sectional view of fluid flow around a cylindrical section with an operational synthetic jet actuator embedded therein and ejecting fluid at approximately 45 degrees from the direction of the freestream fluid flow.

FIG. 33C depicts a situation where a synthetic jet actuator 544 is operational and the orifice 546 is aligned to eject fluid 548 from the orifice 546 in a direction exactly opposed to the freestream flow 538. In this configuration, the streamlines 537 are still separated at the rear surface 542 of the cylindrical section 536. However, lift is generated upon the cylindrical section 536 and the drag is reduced. Similarly, if the synthetic jet orifice 546 is at some angle to the direction of the freestream flow 538, lift is produced and drag is reduced. FIG. 33D depicts a typical configuration. Notice that the streamlines 537 are still separated opposite of the synthetic jet fluid 548. However, the entire flow field is dramatically modified. In stark contrast to the prior art, the preferred embodiment 543 comprises a zero net mass synthetic jet actuator 544 which is powerful enough to penetrate the boundary layer of the fluid flow 538 and thereby modify the effective aerodynamic shape of the cylindrical section 536.

B. Modification of Internal Fluid Flows

As described above with reference to FIGS. 6A and 6B, the jet produced by a synthetic jet actuator may be used to alter the apparent aerodynamic shape of a structure in a flow field. In the example shown in FIGS. 6A and 6B, the synthetic jet 10 was used to alter the apparent aerodynamic shape of an airfoil 92 so as to create a bounded recirculation region 96 on the skin 92 or surface of the airfoil 91. It should be understood that the synthetic jet actuator according to the invention may have applications other than that described with reference to FIGS. 6A and 6B.

Particularly, the system described herein may be used to modify flows across surfaces when the flows are not "free." That is, flows which are bounded (such as through a pipe or nozzle) may also be altered by modifying the apparent aerodynamic shape of the surface bounding the flow. One application would be to actively tailor a diffuser nozzle by placing synthetic jet actuators in the nozzle area. Another embodiment of internal flow modification would be to create a "lobed mixer" with synthetic jet actuators.

Figure 24:
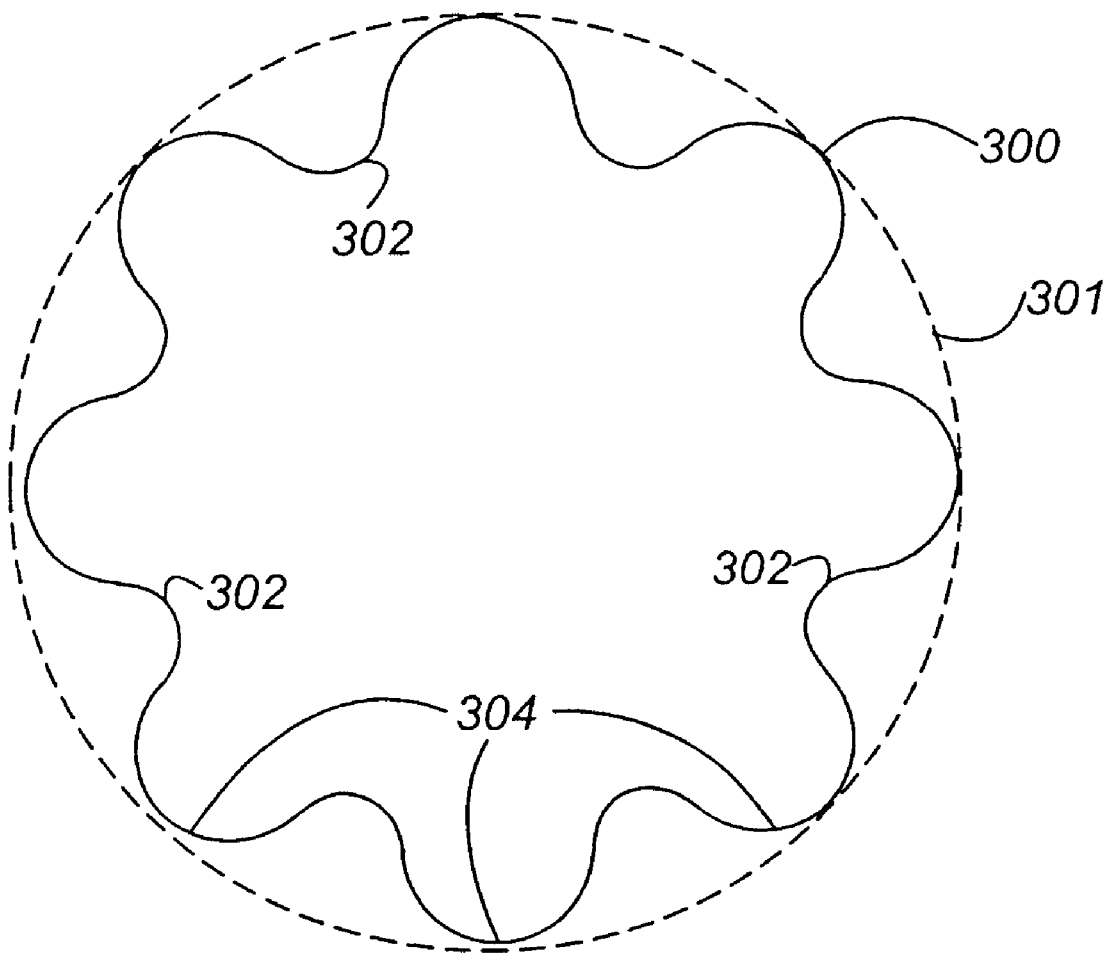
FIG. 24 is a cross-sectional end view of a conventional structure having lobed surfaces for promoting mixtures within a fluid flow.

For instance, a conventional "lobed" mixer 300, such as one for an exhaust port of a jet engine, is corrugated and has a number of lobes defined by raised curved portions 302 and recessed curved portions 304. See FIG. 24. The mixer 300 is shown superimposed within a circular cross-section 301 in order to highlight the corrugated nature of the mixer 300. The mixer 300 is formed with the lobes in order to produce counter-rotating vortices, which promote mixing, in the direction of the exhaust flow. A disadvantage to the mixer 300, however, is that the dimensions of the lobes are fixed whereby the effectiveness of the mixer 300 varies with the speed of the exhaust flow.

Figure 25A:
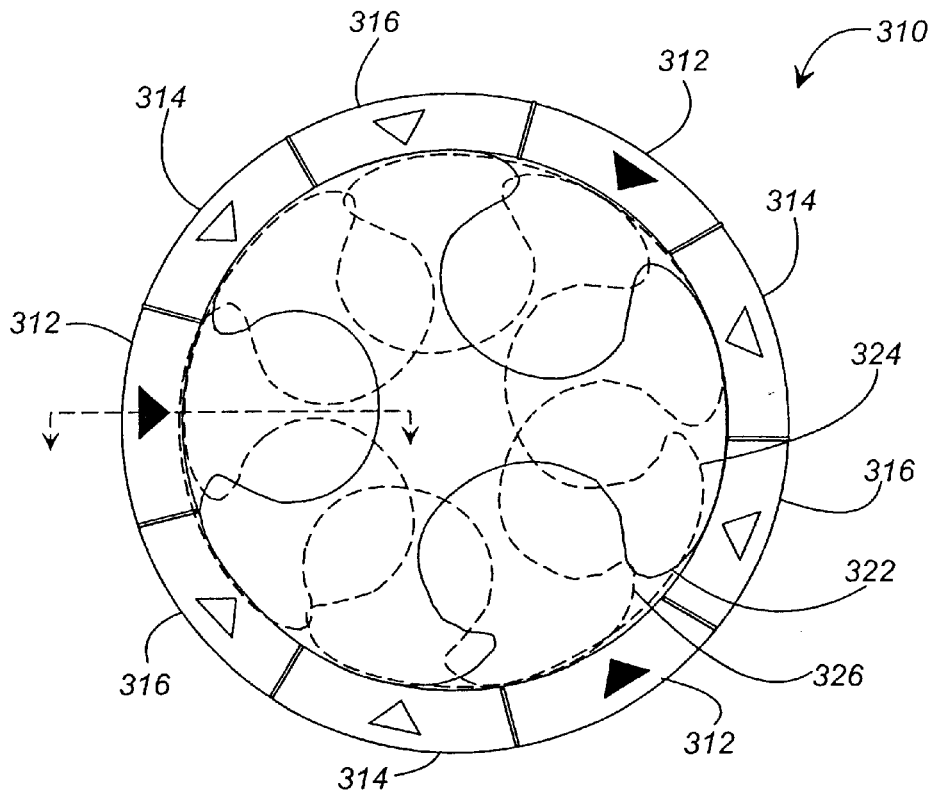
FIG. 25A is a cross-sectional end view of a structure according to the invention having synthetic jet actuators for emulating the lobed surface of FIG. 24.
Figure 25B:
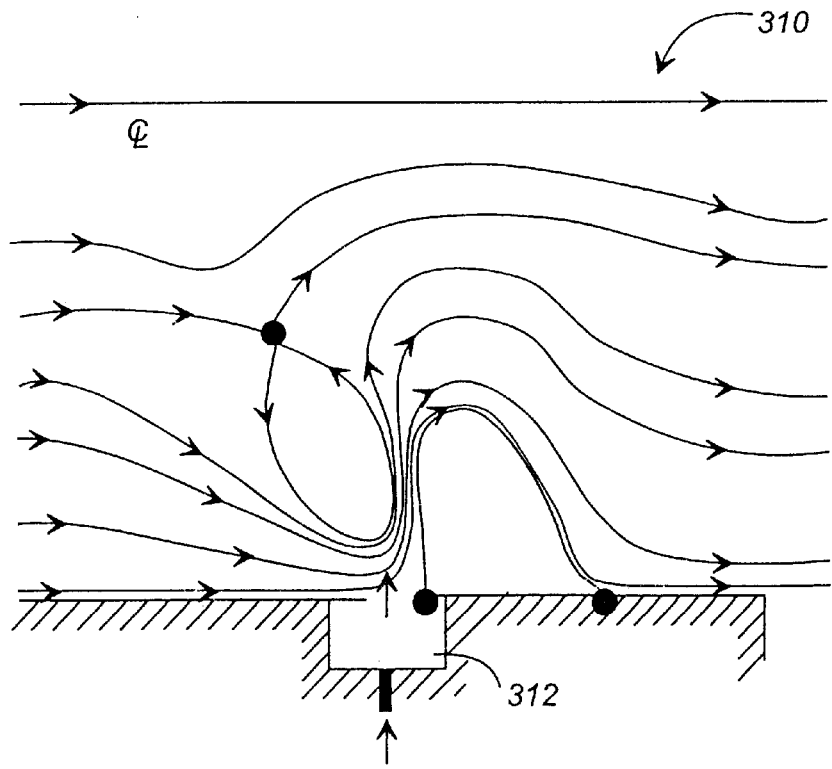
FIG. 25B is a sectional view of fluid flows within the structure of FIG. 25A.

A mixer 310 according to the invention is shown in FIGS. 25A and 25B and comprises a plurality of synthetic jets 312, 314, and 316 arrayed about the inner circumference of the mixer 310. These synthetic jets may be of any variety—conventional synthetic jets 10 as in FIGS. 1A–1C, constant suction synthetic jets as in FIG. 31, louvered synthetic jet actuators as in FIGS. 17A-17B, or other embodiments of synthetic jet actuators obvious to one skilled in the art.

In operation, a first set of synthetic jets 312 is operated to alter the aerodynamic surface within the mixer 310 so that a first flow pattern 322 is produced. As shown in FIG. 25B, the lobed pattern 322 produced by the first set of synthetic jets 312 promotes mixing of the fluid flow by producing counter-rotating vortices. In this regard, the mixer 310 is similar to mixer 300 in that counter-rotating vortices are produced. The mixer 310, however, differs in that the flows produced by the synthetic jets 312 may be altered according to the speed of the primary fluid flow through the mixer 310. More specifically, the force of the jets exiting the jets 312 can be adjusted to generate a boundary surface within the mixer 310 which provides a n optimal surface for mixing fluid at the current velocity of fluid flow. Thus, in contrast to mixer 300, the mixer 310 according to the invention can operate optimally over a wide range of jet exhaust flow rates.

The mixer 310 according to the invention also differs from the mixer 300 in that the lobed pattern can be rotated within the mixer 310. After the first set of synthetic jets 312 produces the lobed pattern 322, the first set of synthetic jets 312 is deactivated and a second set of synthetic jets 314 is activated to generate a lobed pattern 324. The second set of synthetic jets 314 is next deactivated and a third set of synthetic jets 316 is activated to generate a lobed pattern 326. The operation of the mixer 310 then repeats the process by beginning with the first set of synthetic jets 312. In this manner, the lobed pattern of the mixer 310 rotates about the circumference of the mixer 310 from pattern 322, to pattern 324, and to pattern 326. The spinning of the lobed patterns about the mixer 310 substantially increases mixing and, consequently, reduces pollution as well as noise.

The synthetic jets 312, 314, and 316 may be controlled with any suitable system or device. Since the synthetic jets 312, 314, and 316 are activated and deactivated at relatively high speeds, however, the synthetic jets 312, 314, and 316 are preferably controlled with high speed electronics, which does not form any part of the present invention.

The mixer 310 according to the invention may be used to mix other fluids. For instance, the mixer 310 may be used as a combustor in a jet engine. Typically, a combustor has a length which is dictated by the flow rate and mixing rate. With the mixer according to the invention having a plurality of synthetic jets, the amount of time needed to thoroughly mix the reactants is significantly decreased for a certain fluid flow rate. Since mixing occurs much sooner with the mixer 310, the length of the mixer 310 may be decreased, thereby also decreasing the weight and length of the jet engine.

While not shown, the mixer 310 according to the invention may have synthetic jets arranged along the length of the mixer 310 as well as the circumference of the mixer 310. The synthetic jets which are activated at a single time may be at the same positions about the circumference of the mixer 310 or, preferably, may be at staggered positions around the circumference of the mixer 310 so as to further rotate and mix the fluid as the fluid travels along the length of the mixer 310. Other variations in the number and arrangement of synthetic jets will be apparent to those skilled in the art.

We claim:

1. A system for modifying a fluid flow over a solid body, comprising:

(a) a synthetic jet actuator positioned in the solid body, said synthetic jet actuator having:

a jet housing defined by walls, said jet housing having an internal chamber with a volume of fluid and an opening in said jet housing connecting said chamber to an external environment having said fluid, and a volume changing means for periodically changing said volume within said internal chamber so that a series of fluid vortices are generated and projected in said external environment out from said opening of said jet housing;

(b) a synthetic jet stream formed by said fluid vortices entraining said fluid of said external environment, said synthetic jet stream projected outwardly from the solid body, wherein said fluid flowing over said body contacts said synthetic jet stream, said direction of said fluid flow being modified by said synthetic jet stream.

2. The system of claim 1, wherein said synthetic jet further comprises at least one louver attached to said housing and aligned with an opening in said housing, wherein said one louver permits fluid flow in only one direction either into said chamber or out of said chamber whereby said one louver is a one-way valve.

3. The system of claim 1, wherein said synthetic jet stream emanates in a direction opposite to a direction of the fluid flowing over the solid body.

4. The system of claim 1, wherein said synthetic jet stream emanates at an angle to a direction of the fluid flowing over the solid body.

5. A system for modifying a fluid flow over a solid body comprising:

(a) a synthetic jet actuator positioned in the solid body, said synthetic jet actuator having
  (i) a first tubular section embedded in a solid body with an exit co-planar with an outer surface of said solid body,
  (ii) a second tubular section inside of and concentric to said first tubular section, wherein an exit of said second tubular section is recessed below said exit of said first tubular section,
  (iii) a means for supplying a constant suction in said second tubular section for drawing an ambient fluid into and through said second tubular section, and
  (iv) a means for controlling a flow of fluid through said first tubular section; and
(b) a series of fluid vortices emanating from said synthetic jet actuator, said vortices forming a synthetic jet stream projecting outwardly from the solid body, wherein said fluid flowing over the solid body contacts said synthetic jet stream, said direction of the fluid flow being modified by said synthetic jet stream.

6. A system for causing fluid flow in a bounded volume, comprising:
  (a) an air pocket on an aerodynamic surface forming said bounded volume; and
  (b) a synthetic jet actuator situated within said bounded volume, said synthetic jet actuator to emit vortices to entrain an ambient fluid to cause said fluid flow within said volume.

7. The system of claim 6, wherein said synthetic jet comprises:
  (a) a first cylindrical section embedded in said aerodynamic surface with an exit in an outer surface of said aerodynamic surface;
  (b) a second cylindrical section inside of and concentric to said first cylindrical section, wherein an exit of said second cylindrical section is recessed below said exit of said first cylindrical section;
  (c) a means for supplying a constant suction in said second cylindrical section for drawing an ambient fluid into and through said second cylindrical section; and
  (d) a means for alternately turning on and off a flow of fluid through said first cylindrical section.

8. The system of claim 6, wherein the aerodynamic surface comprises a wing.

9. A method for modifying a direction of a fluid stream flowing along a solid body, comprising the steps of:
  (a) providing said fluid stream flowing along the solid body;
  (b) generating a synthetic jet stream from said solid body that comprises a series of fluid vortices;
  (c) creating a bounded air pocket on said solid body with said synthetic jet stream;
  (d) passing said fluid stream over said solid body; and
  (e) modifying said direction of said fluid stream by contacting said fluid stream with said air pocket.

10. A method for causing fluid flow in a bounded volume, comprising the steps of:
  (a) providing an aerodynamic surface;
  (b) generating a synthetic jet stream out of said aerodynamic surface, wherein said synthetic jet stream comprises a series of spaced fluid vortices; and
  (c) creating said bounded volume as an air pocket on said aerodynamic surface of a flying object.

11. A mixer apparatus for mixing fluid traveling in a downstream direction, comprising:

(a) a cylindrical tubular structure having an inner surface with a circular cross-section; and
(b) a plurality of synthetic jets arrayed about said circular cross-section of said cylindrical tubular structure, each of said synthetic jets comprising:
  (1) a jet housing having an orifice formed in a wall of said housing; and
  (2) means for withdrawing fluid into said orifice and means for forcing fluid out of said orifice;
wherein said plurality of synthetic jets alter an aerodynamic surface of said structure so that said structure has a lobed cross-section of a certain pattern, lobes forming said lobed cross-section of said certain pattern promoting mixing of said fluid by generating vortices.

12. The mixer apparatus as set forth in claim 11, further comprising a second set of synthetic jets arrayed about said circular cross-section of said structure and staggered relative to said about said plurality of synthetic jets, said second set of synthetic jets altering said aerodynamic surface of said structure so that said structure has a second lobed cross-section of a second pattern.

13. The mixer apparatus as set forth in claim 12, wherein said second lobed cross-section of said second pattern is equal to said lobed cross-section of said certain pattern rotated about cross-section of said structure.

14. A system for modifying a fluid flow over an airfoil, comprising:
  (a) a synthetic jet actuator positioned in the airfoil, said synthetic jet actuator having:
    a jet housing defined by walls, said jet housing having an internal chamber with a volume of fluid and an opening in said jet housing connecting said chamber to an external environment having said fluid, and
    a volume changing means for periodically changing said volume within said internal chamber so that a series of fluid vortices are generated and projected in said external environment out from said opening of said jet housing; and
  (b) a synthetic jet stream formed by said fluid vortices, said synthetic jet stream emanating from said synthetic jet actuator and projected outwardly from the airfoil, wherein said fluid flowing over said airfoil contacts said synthetic jet stream, said direction of said fluid flow being modified by said synthetic jet stream.

15. A system for causing fluid flow in a bounded volume, comprising:
  (a) an air pocket on an aerodynamic surface forming said bounded volume; and
  (b) a synthetic jet actuator situated within said bounded volume to cause said fluid flow within said volume, said synthetic jet actuator having:
    a jet housing defined by walls, said jet housing having an internal chamber with a volume of fluid and an opening in said jet housing connecting said chamber to an external environment having said fluid, and
    a volume changing means for periodically changing said volume within said internal chamber so that a series of fluid vortices are generated and projected in said external environment out from said opening of said jet housing.

16. The system of claim 15, wherein said synthetic jet further comprises at least one louver attached to said housing and aligned with an opening in said housing, wherein said one louver permits fluid flow in only one direction either into said chamber or out of said chamber whereby said one louver is a one-way valve.

* * * * *